(12) United States Patent
Kim et al.

(10) Patent No.: US 10,833,124 B2
(45) Date of Patent: Nov. 10, 2020

(54) SEMICONDUCTOR DEVICES INCLUDING DATA STORAGE PATTERNS

(71) Applicant: Samsung Electronics Co., Ltd., Suwon-si (KR)

(72) Inventors: Kyo Seop Kim, Hwaseong-si (KR); Chang Woo Sun, Hwaseong-si (KR); Gyu Hwan Oh, Hwaseong-si (KR); Joon Kim, Seoul (KR); Joon Youn Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 44 days.

(21) Appl. No.: 15/953,573

(22) Filed: Apr. 16, 2018

(65) Prior Publication Data

US 2019/0109175 A1 Apr. 11, 2019

(30) Foreign Application Priority Data

Oct. 11, 2017 (KR) .................. 10-2017-0131614

(51) Int. Cl.
*H01L 23/525* (2006.01)
*H01L 27/24* (2006.01)
*H01L 45/00* (2006.01)

(52) U.S. Cl.
CPC ........ *H01L 27/2427* (2013.01); *H01L 23/525* (2013.01); *H01L 27/2463* (2013.01); *H01L 27/2481* (2013.01); *H01L 45/06* (2013.01); *H01L 45/1233* (2013.01); *H01L 45/144* (2013.01)

(58) Field of Classification Search
CPC . H01L 45/06; H01L 45/1233; H01L 27/2418; H01L 27/2427
See application file for complete search history.

(56) References Cited

U.S. PATENT DOCUMENTS

| 8,557,649 | B2 | 10/2013 | Venigalla et al. |
| 9,590,073 | B2 | 3/2017 | Ryu et al. |
| 2004/0113137 | A1* | 6/2004 | Lowrey ............... H01L 27/2427 257/5 |
| 2015/0279906 | A1* | 10/2015 | Lindenberg ........... H01L 45/144 257/5 |
| 2015/0364358 | A1 | 12/2015 | Tsai et al. |
| 2016/0005959 | A1 | 1/2016 | Li et al. |
| 2016/0133628 | A1 | 5/2016 | Xie et al. |

(Continued)

FOREIGN PATENT DOCUMENTS

KR  10-2006-0099609 A  9/2006

*Primary Examiner* — Kenneth Parker
*Assistant Examiner* — Long H Le
(74) *Attorney, Agent, or Firm* — Sughrue Mion, PLLC

(57) ABSTRACT

A semiconductor device is provided including a base insulating layer on a substrate; a first conductive line that extends in a first direction on the base insulating layer; data storage structures on the first conductive line; selector structures on the data storage structures, each of the selector structures including a lower selector electrode, a selector, and an upper selector electrode; an insulating layer in a space between the selector structures; and a second conductive line disposed on the selector structures and the insulating layer and extended in a second direction intersecting the first direction. An upper surface of the insulating layer is higher than an upper surface of the upper selector electrode.

12 Claims, 23 Drawing Sheets

(56) References Cited

U.S. PATENT DOCUMENTS

| | | | |
|---|---|---|---|
| 2016/0163975 A1* | 6/2016 | Petz | H01L 45/12 |
| | | | 257/4 |
| 2017/0033001 A1 | 2/2017 | Bedell et al. | |
| 2017/0054070 A1 | 2/2017 | Bak et al. | |
| 2017/0141305 A1* | 5/2017 | Yang | H01L 45/1608 |

* cited by examiner

SEMICONDUCTOR DEVICES INCLUDING DATA STORAGE PATTERNS

CLAIM OF PRIORITY

This application claims priority under 35 U.S.C. § 119 to Korean Patent Application No. 10-2017-0131614, filed on Oct. 11, 2017 in the Korean Intellectual Property Office, the disclosure of which is hereby incorporated herein by reference as if set forth in its entirety.

FIELD

The present inventive concept relate generally to semiconductor devices and, more particularly, to semiconductor devices including data storage patterns.

BACKGROUND

High performance and low power consumption semiconductor devices, such as memory devices, next-generation memory devices, such as a phase-change random-access memory (PRAM), a resistive random access memory (RRAM), a magnetoresistive random access memory (MRAM) and the like have been developed. Such next-generation memory devices may be formed using a data storage material in which resistance values may be changed according to an electric current or a voltage, and resistance values may be maintained, even in the case in which supply of an electric current or a voltage is lost or removed. In order to increase a degree of integration in such next generation memory devices, memory devices including memory cells arranged to have a three-dimensional structure have been developed, but unexpected defects have occurred.

SUMMARY

Some embodiments of the present inventive concept provide a semiconductor device including a base insulating layer on a substrate; a first conductive line extending in a first direction on the base insulating layer; data storage structures on the first conductive line; selector structures on the data storage structures, each of the selector structures including a lower selector electrode, a selector, and an upper selector electrode; an insulating layer filling a space between the selector structures; and a second conductive line on the selector structures and the insulating layer and extending in a second direction, different from and intersecting the first direction. An upper surface of the insulating layer is higher than an upper surface of the upper selector electrode.

Further embodiments of the present inventive concept provide a semiconductor including a first conductive line extending in a first direction on a substrate; a second conductive line extending in a second direction, different from and intersecting the first direction; switch structures between the first conductive line and the second conductive line, each of the switch structures including a lower switch electrode, a switch, and an upper switch electrode; an insulating layer in a space between the switch structures. An upper surface of the insulating layer is higher than an upper surface of the upper switch electrode.

Still further embodiments of the present inventive concept provide semiconductor devices including a base insulating layer on a substrate; a first conductive line extending in a first direction on the base insulating layer; data storage structures on the first conductive line; selector structures on the data storage structures; an insulating layer filling a space between the selector structures; second conductive lines on the selector structures and the insulating layer and extending in a second direction, different from and intersecting the first direction. Each of the selector structures includes a lower selector electrode, a lower interface pattern, a selector, an upper interface pattern, and an upper selector electrode, and an upper surface of the insulating layer is higher than an upper surface of the upper selector electrode.

DETAILED DESCRIPTION

Figure 1:
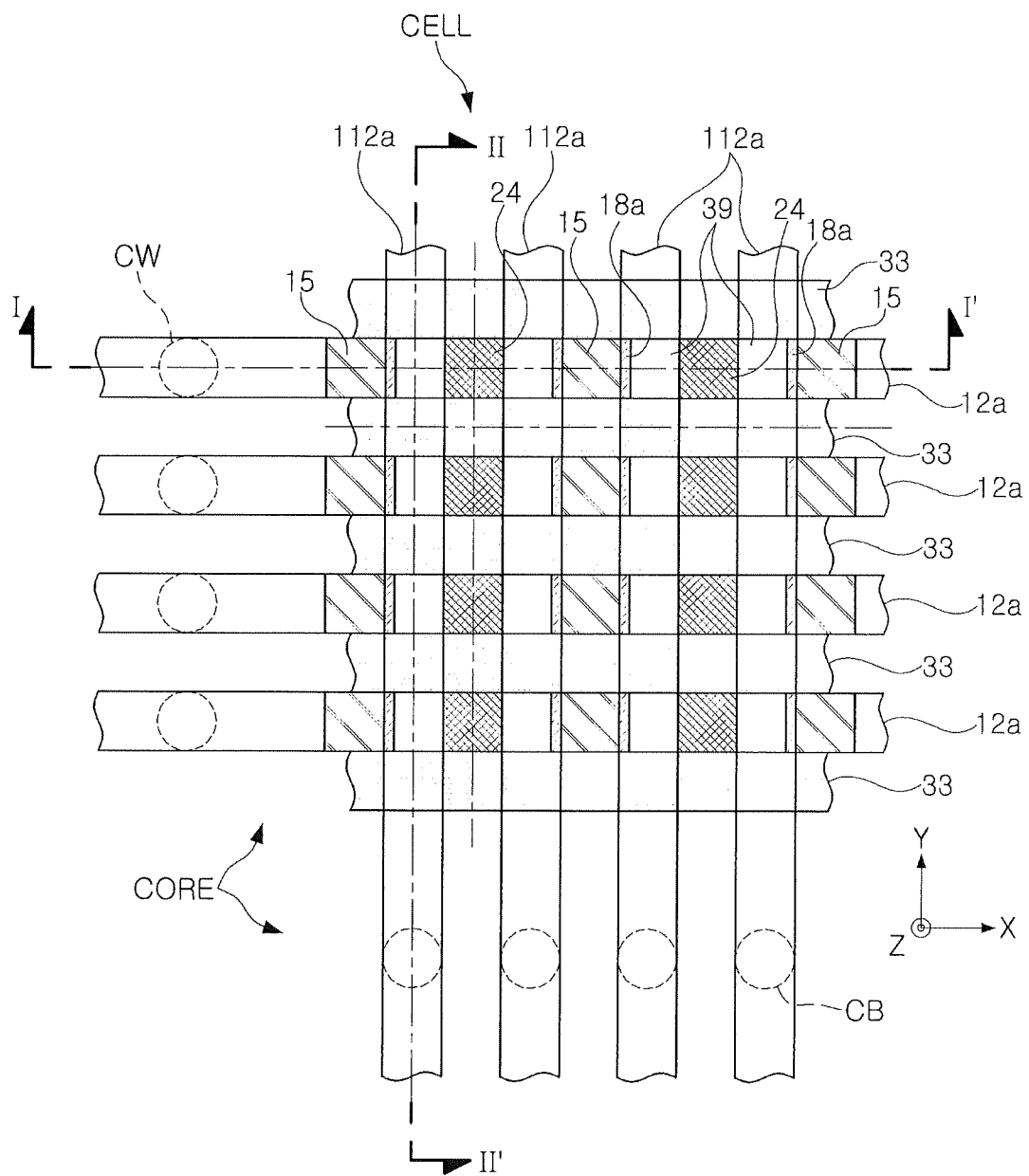
FIG. 1 is a top view of a semiconductor device illustrating a semiconductor device in accordance with some embodiments of the present inventive concept.

The inventive concept will now be discussed more fully hereinafter with reference to the accompanying drawings, in which exemplary embodiments of the inventive concept are shown. The inventive concept and methods of achieving the inventive concept will be apparent from the following exemplary embodiments that will be discussed in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. As used herein, the term "and/or" includes any and all combinations of some of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of some other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be discussed with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes.

Exemplary embodiments of aspects of the present inventive concept explained and illustrated herein include their complementary counterparts. The same reference numerals or the same reference designators denote the same elements throughout the specification.

Figure 2:
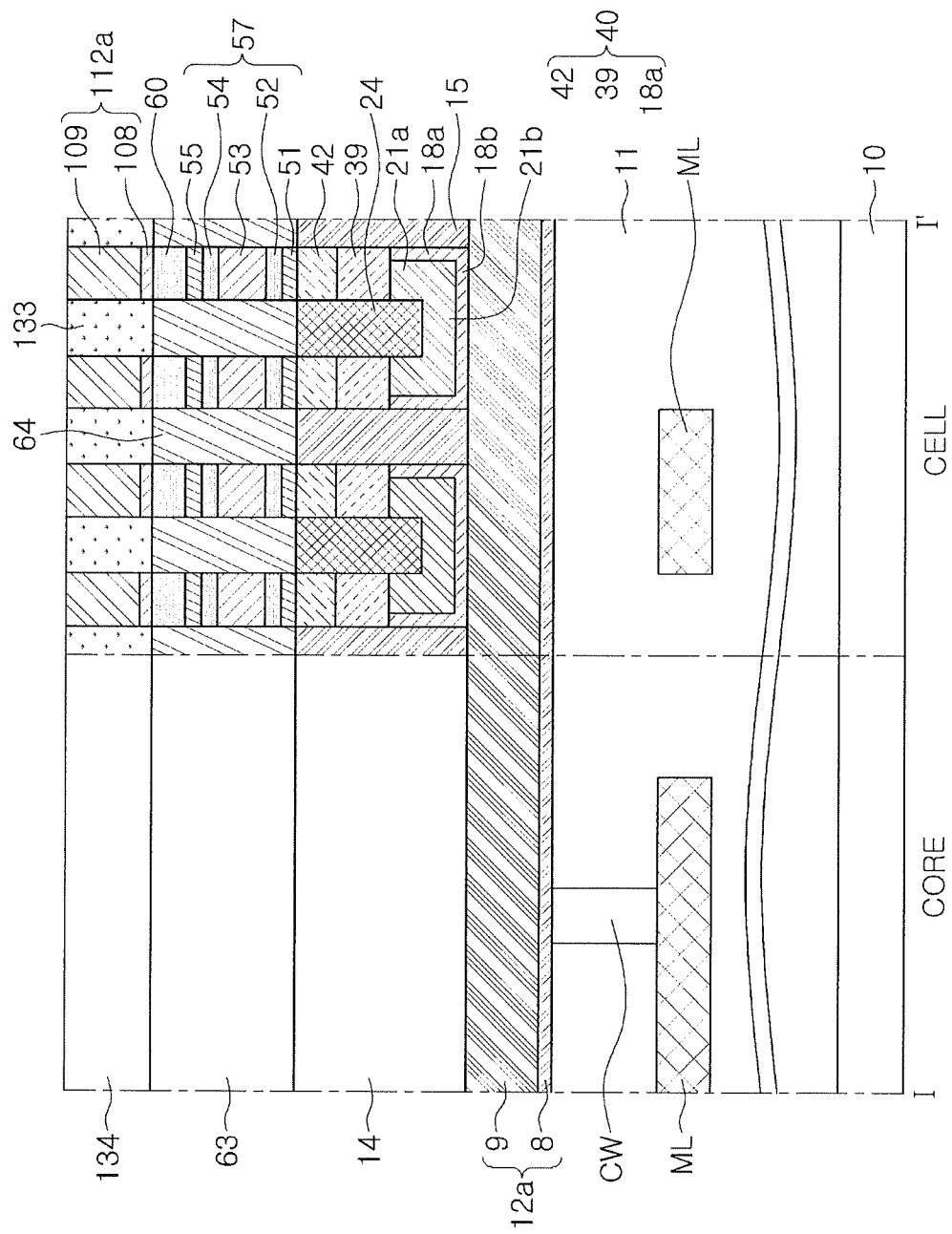
FIGS. 2 and 3 are cross-sections along the lines I-I' and II-II', respectively, of FIG. 1 illustrating semiconductor devices according to some embodiments of the present inventive concept.
Figure 3:
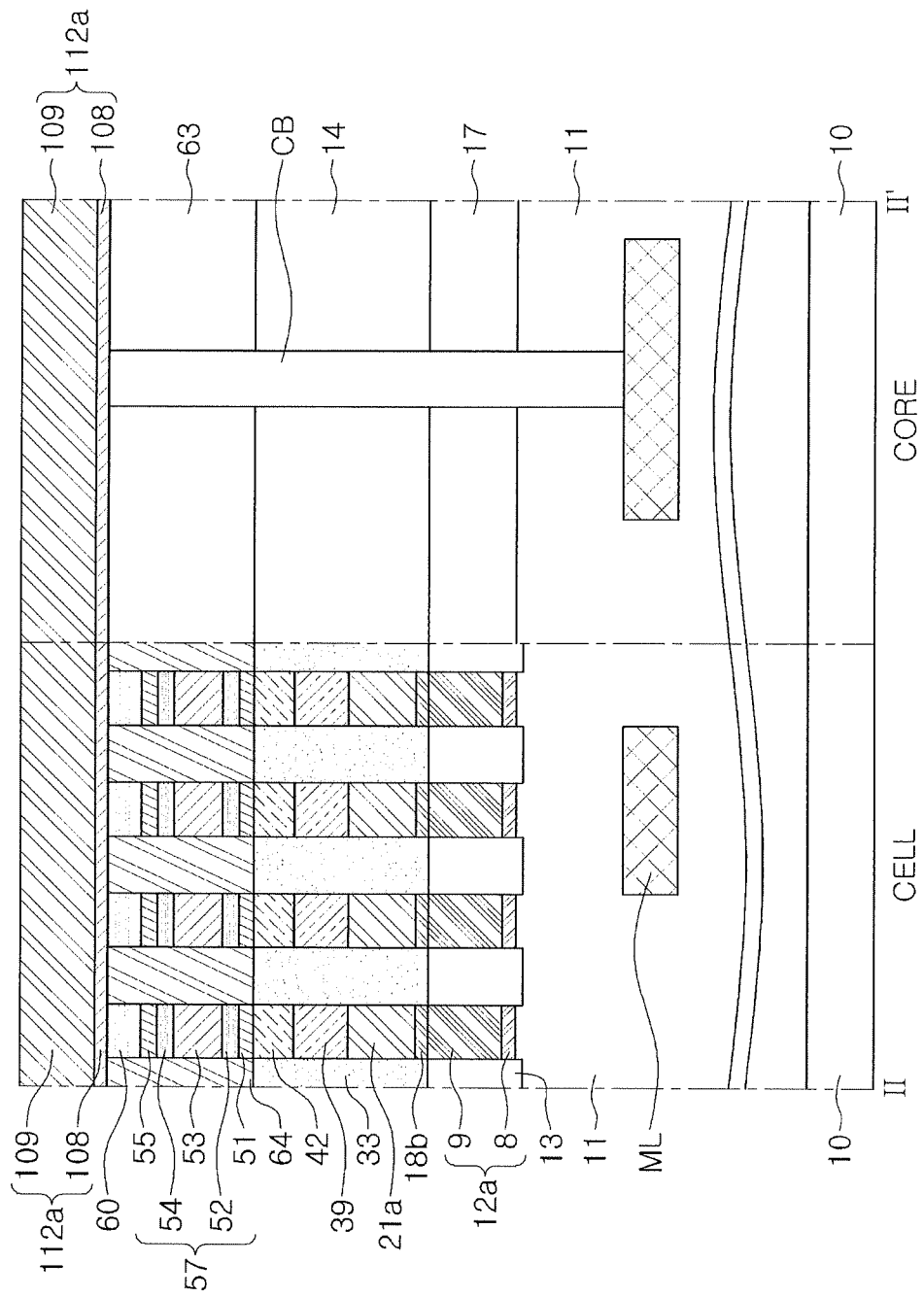

FIG. 1 is a top view illustrating semiconductor devices in accordance with some embodiments of the present inventive concept. FIGS. 2 and 3 are cross-sections along the line I-I' and II-II', respectively, of FIG. 1 illustrating semiconductor devices in accordance with some embodiments of the present inventive concept.

As illustrated in FIGS. 1, 2, and 3, a base insulating layer 11 may be disposed on a substrate 10. The substrate 10 may be provided as a semiconductor substrate formed using a semiconductor material, such as silicon (Si). The base insulating layer 11 may be formed using an insulating material, such as a silicon oxide. However, embodiments are not limited to these examples. In some embodiments, the semiconductor device may have a structure in which a peripheral circuit region is disposed below a cell region CELL.

A plurality of circuit transistors forming peripheral circuits may be disposed on the substrate 10. Furthermore, circuit wirings ML connected to the plurality of circuit transistors may be disposed on the substrate 10. The substrate 10 may include the cell region CELL and a core region CORE disposed adjacent thereto. First contact plugs CW and second contact plugs CB, connected to a portion of the circuit wirings ML may be disposed in the core region CORE.

First conductive lines 12a extend in a first direction (e.g., an X direction) parallel to a surface of the substrate 10 and are disposed to be spaced apart from each other on the base insulating layer 11. The first contact plugs CW may be connected to the first conductive lines 12a. First gap fill patterns 13 may be disposed between the first conductive lines 12a. The first gap fill patterns 13 may also be extended in the first direction. Each of the first conductive lines 12a may include a first lower conductive layer 8 and a second lower conductive layer 9, sequentially stacked. In some embodiments, the first lower conductive layer 8 may be formed using a barrier layer, such as titanium (Ti) and titanium nitride (TiN). The second lower conductive layer 9 may be formed using a material having a low specific resistance, such as tungsten (W). A single first conductive line 12a may be disposed between a pair of first gap fill patterns 13 disposed adjacent to each other among the first gap fill patterns 13.

First insulating patterns 15 may be disposed on the first conductive lines 12a in the cell region CELL. Second insulating patterns 33 may be disposed on the first gap fill patterns 13. The second insulating patterns 33 may also be extended in the first direction.

A first interlayer insulating layer 17 and a second interlayer insulating layer 14 may be disposed on the base insulating layer 11 in the core region CORE. The second interlayer insulating layer 14 may cover the first conductive lines 12a.

Data storage structures 40 may be disposed between the first insulating patterns 15 and on the first conductive lines 12a in the cell region CELL. Each of the data storage structures 40 may include a lower electrode 18a, a data storage pattern 39, and upper electrodes 42, sequentially stacked. The first insulating patterns 15 and the data storage structures 40 may be disposed between the second insulating patterns 33.

The lower electrodes 18a may be disposed between the data storage patterns 39 and the first conductive lines 12a and may be in contact with the data storage patterns 39. The lower electrodes 18a may be in contact with the first insulating patterns 15. When viewed from above, the lower electrodes 18a may have a linear or bar shape parallel to a surface of the substrate 10 and extended in a second direction Y, perpendicular to the first direction X. The upper electrodes 42 may be disposed on the data storage patterns 39 and may be in contact with the data storage patterns 39.

A pair of data storage patterns 39 opposing each other among the data storage patterns 39 may be disposed between a pair of first insulating patterns 15 disposed adjacent to each other on a single first conductive line 12a. A lower electrode connection portion 18b may be extended in a direction parallel to the surface of the substrate 10 from a lower portion of the lower electrodes 18a. Between the pair of first insulating patterns 15 disposed adjacent to each other on a single first conductive line 12a, the lower electrode connection portion 18b extended from the lower portion of the lower electrodes 18a in contact with a pair of data storage patterns 39 may be disposed. The lower electrode connection portion 18b may be extended in the first direction, parallel to the surface of the substrate 10, from the lower portion of the lower electrodes 18a. The lower electrode connection portion 18b may be in contact with the first conductive line 12a.

The lower electrode connection portion 18b may be formed integrally with the lower electrodes 18a between the pair of first insulating patterns 15 disposed adjacent to each other on a single first conductive line 12a.

Spacers 21a may be disposed between the second insulating patterns 33. The spacers 21a may be disposed between the data storage patterns 39 and the first conductive lines 12a. The spacers 21a may overlap lower surfaces of the data storage patterns 39 together with the lower electrodes 18a. The spacers 21a may be in contact with the lower surfaces of the data storage patterns 39 together with the lower electrodes 18a.

A spacer connection portion 21b may be disposed on the lower electrode connection portion 18b between the pair of first insulating patterns 15 disposed adjacent to each other on a single first conductive line 12a. The spacers 21a may be extended in a direction from opposing ends of the spacer connection portion 21b to an upper portion to be in contact with the data storage patterns 39 between the pair of first insulating patterns 15 disposed adjacent to each other on a single first conductive line 12a. The spacers 21a may be formed integrally with the spacer connection portion 21b.

The lower electrodes 18a may be disposed between the spacers 21a and the first insulating patterns 15. The lower electrode connection portion 18b may be disposed between the spacer connection portion 21b and the first conductive line 12a.

A first gap fill pattern 24 may be disposed between the upper electrodes 42, between the data storage patterns 39, and between the spacers 21a, between the pair of first insulating patterns 15 disposed adjacent to each other on a single first conductive line 12a. The first gap fill pattern 24 may be disposed between the second insulating patterns 33.

Selector structures 57 may be disposed on the upper electrodes 42 in the cell region CELL. The selector structures 57 may be referred to as a switch structure. A gap fill insulating layer 64 may be disposed to fill a space between the selector structures 57. A third interlayer insulating layer 63 may be disposed on the second interlayer insulating layer 14 in the core region CORE.

Each of the selector structures 57 may include a lower selector electrode 51, a selector 53, and an upper selector electrode 55, sequentially stacked. Each of the selector structures 57 may further include an upper interface pattern 54 disposed between the upper selector electrode 55 and the selector 53, as well as a lower interface pattern 52 disposed between the lower selector electrode 51 and the selector 53. The lower selector electrode 51 may be referred to as a lower switch electrode, the selector 53 may be referred to as a switch, and the upper selector electrode 55 may be referred to as an upper switch electrode.

The lower selector electrodes 51 may correspond to the upper electrodes 42 on a one-to-one basis and may be electrically connected to the upper electrodes 42.

An upper surface of the gap fill insulating layer 64 may be higher than an upper surface of the upper selector electrode 55.

Connection patterns 60 may be disposed on the selector structures 57. The connection patterns 60 may be referred to as plugs. Upper surfaces of the connection patterns 60 may be coplanar with the upper surface of the gap fill insulating layer 64. In an exemplary embodiment, the upper surfaces of the connection patterns 60 may be higher than the upper surface of the gap fill insulating layer 64. A width of the connection patterns 60 may be equal to a width of the upper selector electrode 55.

The connection patterns 60 may be formed using a conductive material. The connection patterns 60 may be formed using a material different from the upper selector electrode 55. The connection patterns 60 may be formed using polycrystalline silicon, a carbon-based conductive material, a silicon oxide, or combinations thereof. The carbon-based conductive material may be provided as a material including C, CN, TiCN, TaCN or combinations thereof. The connection patterns 60, the upper interface patterns 54, and the lower interface patterns 52 may be formed using the same material. The connection patterns 60, the upper interface patterns 54, and the lower interface patterns 52 may be formed using, for example, carbon (C). The lower selector electrodes 51 and the upper selector electrode 55 may include, for example, TiN, TiAlN, TaN, WN, MoN, TiSiN, TiBN, ZrSiN, WSiN, WBN, ZrAlN, MoAlN, TaSiN, TaAlN, TiON, TiAlON, WON, TaON or combinations thereof.

Second conductive lines 112a may be disposed on the first selector structures 57 and the third interlayer insulating layer 63 in the cell region CELL. Second gap fill patterns 133 may be disposed between the second conductive lines 112a. The second conductive lines 112a and the second gap fill patterns 133 may be extended in the second direction (e.g., a Y-axis direction) intersecting the first direction (e.g., the X-axis direction). The second conductive lines 112a may intersect the first conductive lines 12a, while the second gap fill patterns 133 may intersect the first gap fill patterns 13. The second gap fill patterns 133 may intersect the second insulating patterns 33.

A single second conductive line 112a may be disposed between a pair of second gap fill patterns 133 disposed adjacent to each other. Each of the second conductive lines 112a may include a first upper conductive layer 108 and a second upper conductive layer 109, sequentially stacked. The first upper conductive layer 108 and the second upper conductive layer 109 may have side surfaces vertically aligned. The second conductive lines 112a may be formed using the same material as the first conductive lines 12a.

A fourth interlayer insulating layer 134 may be disposed on the third interlayer insulating layer 63 in the core region CORE.

A lower surface of the first contact plugs CW may be in contact with the circuit wiring ML, while an upper surface of the first contact plugs CW may be in contact with the first conductive lines 12a.

The second contact plugs CB may penetrate through the base insulating layer 11, the first interlayer insulating layer 17, the second interlayer insulating layer 14, and the third interlayer insulating layer 63. A lower surface of the second contact plugs CB may be in contact with the circuit wiring ML, while an upper surface of the second contact plugs CB may be in contact with the second conductive lines 112a.

The first gap fill patterns 13 and the second interlayer insulating layer 14 may be formed, for example, using an insulating material, such as a silicon nitride. The first interlayer insulating layer 17 may be formed, for example, using an insulating material, such as a silicon oxide.

The first insulating patterns 15 and the second insulating patterns 33 may be formed, for example, using an insulating material, such as a silicon nitride. The spacers 21a may be formed using a material having etching selectivity with the first insulating patterns 15 and the second insulating patterns 33. The spacers 21a may be formed, for example, using an insulating material, such as a silicon oxide. The first gap fill patterns 24 may be formed using an insulating material, such as a silicon oxide or a silicon nitride.

The gap fill insulating layer 64 may be formed, for example, using an insulating material, such as a silicon nitride. The third interlayer insulating layer 63 may be formed, for example, using an insulating material, such as a silicon oxide.

In some embodiments, the data storage patterns 39 may be formed using a material storing data using a resistance change. For example, the data storage patterns 39 may be formed using a phase-change memory material phase-changed from an amorphous phase having a high specific resistance to a crystalline phase having a low specific resistance or from the crystalline phase to the amorphous phase depending on a temperature to which, and a time for which, the data storage patterns 39 are heated by an electric current applied thereto. The phase-change memory material used as the data storage patterns 39 may be provided as a chalcogenide material including germanium (Ge), antimony (Sb), and/or tellurium (Te), or a material including at least one element of Te or selenium (Se) and including at least one element of Ge, Sb, bismuth (Bi), rubidium (Pb), tin (Sn), arsenic (As), sulfur (S), silicon (Si), phosphorus (P), oxygen (O), nitrogen (N) or indium (In). The phase-change memory material used as the data storage patterns 39 may be formed using a material having a supper lattice structure, formed by repetitively stacking GsTe—SbTe, an In—Sb—Te (IST) material, or a Bi—Sb—Te (BST) material.

In some embodiments, the lower electrodes 18a may be formed using a conductive material including TiN, TiAlN, TaN, WN, MoN, TiSiN, TiBN, ZrSiN, SiN, WBN, ZrAlN, MoAlN, TaSiN, TaAlN, TiON, TiAlON, or combinations thereof and/or a carbon-based conductive material. Here, the carbon-based conductive material may be provided as a material including C, CN, TiCN, TaCN or combinations thereof.

In some embodiments, the upper electrodes 42 may be formed using a conductive material including TiN, TiAlN, TaN, WN, MoN, TiSiN, TiBN, ZrSiN, WSiN, WBN, ZrAlN, MoAlN, TaSiN, TaAlN, TiON, TiAlON, or combinations thereof and/or a carbon-based conductive material.

In some embodiments, the selectors 53 may be formed using a threshold switching material. For example, the selectors 53 may be formed using an ovonic threshold switching material.

The selectors 53 may be formed using a chalcogenide-based material different from the chalcogenide material used in the data storage patterns 39. For example, the data storage patterns 39 may be formed using the phase-change memory material (e.g., an alloy including Ge, Sb and/or Te, or the like) phase-changed from a crystalline phase to an amorphous phase or from the amorphous phase to the crystalline phase when a semiconductor device, such as a phase-change random-access memory (PRAM), is operated. The selectors 53 may be formed using a chalcogenide-based ovonic threshold switching material maintaining the amorphous phase when the semiconductor device is operated. The selectors 53 may maintain an amorphous phase, even in the case in which a voltage having a magnitude greater than or equal to a threshold voltage Vth is applied, and an off state may be switched to an on state.

The selectors 53 may include an alloy material including at least two or more elements among As, S, Se, Te, or Ge or an additional element (e.g, Si, N, or the like) maintaining the amorphous phase at a higher temperature in addition to the alloy material. In some embodiments, the selectors 53 may be formed using one alloy material among an alloy material including Te, As, Ge, and Si, an alloy material including Ge, Te, and Pb, an alloy material including Ge, Se, and Te, an alloy material including Al, As, and Te, an alloy material including Se, As, Ge, and Si, an alloy material including Se, As, Ge, and C, an alloy material including Se, Te, Ge, and Si, an alloy material including Ge, Sb, Te, and Se, an alloy material including Ge, Bi, Te, and Se, an alloy material including Ge, As, Sb, and Se, an alloy material including Ge, As, Bi and Te, or an alloy material including Ge, As, Bi, and Se. The selectors 53 as a threshold switching device may be formed using a material including one among AsTeGeSiIn, GeTe, SnTe, GeSe, SnSe, AsTeGeSiIn, AsTeGeSiSbS, AsTeGeSiIn, AsTeGeSiIP, AsTeGeSi, As2Te3Ge, As2Se3Ge, As25(Te90Ge10)75, Te40As35Si18Ge6.75In0.25, Te28As34.5Ge15.5S22, Te39As36Si17Ge7P, As10Te21S2Ge15Se50Sb2, Si5Te34As28Ge11S21Sel, AsTeGeSiSeNS, AsTeGeSiIn, AsTeGeSiP, AsSe, AsGeSe, AsTeGeSe, AsTeGeSi, ZnTe, N treatmented OTS, TeAsGeSi, GeTePb, GeSeTe, AlAsTe, SeAsGeSi, SeAsGeC, SeTeGeSi, GeSbTeSe, GeBiTeSe, GeAsSbSe, GeAsBiTe, GeAsBiSe, AsSe, AsSeGe, AsSeGeTe, AsGeTeSi, or GexSel-x.

The selector 53 as the threshold switching device may be switched to the on state when a voltage having a magnitude greater than or equal to the threshold voltage Vth is applied in the off state. Thus, since the selectors 53 as the threshold switching device may be switched using the threshold voltage Vth, the selectors 53 may be used as a switching device. For example, the selectors 53 as the threshold switching device may be used as a switching device of a memory cell array of a semiconductor device, such as a phase-change memory device or a resistance memory device.

In some embodiments, the first conductive lines 12a may be provided as a word line, while the second conductive lines 112a may be provided as a bit line. Alternatively, the first conductive lines 12a may be provided as a bit line, while the second conductive lines 112a may be provided as a word line.

Processing steps in the fabrication of semiconductor devices in accordance with embodiments of the present inventive concept will now be discussed with respect to cross-sections along the line I-I' of FIG. 1 illustrated in FIGS. 4 to 21.

Figure 4:
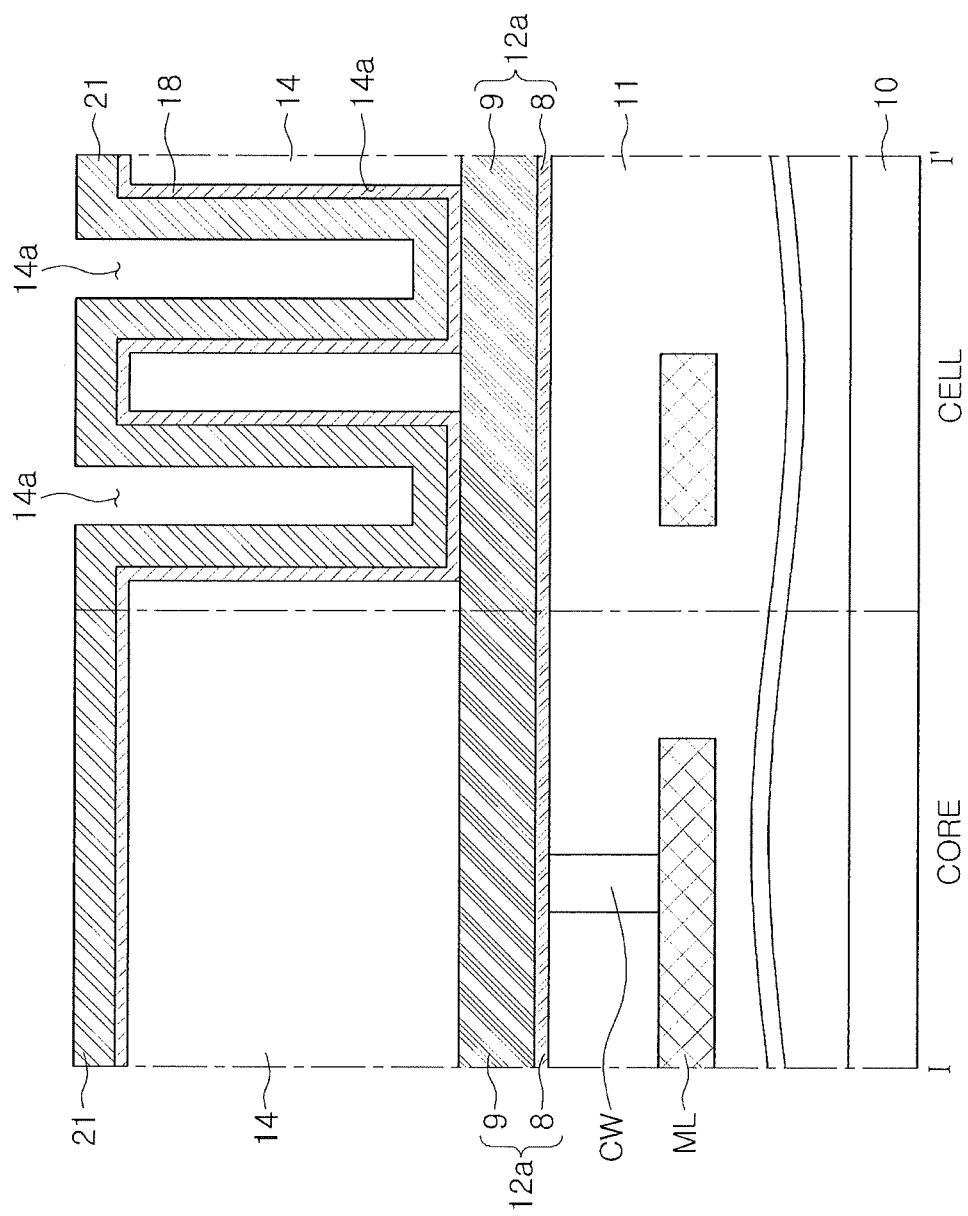
FIGS. 4 to 21 are cross-sections along the line I-I' of FIG. 1 illustrating processing steps in the fabrication of semiconductor devices in accordance with some embodiments of the present inventive concept.
Figure 5:
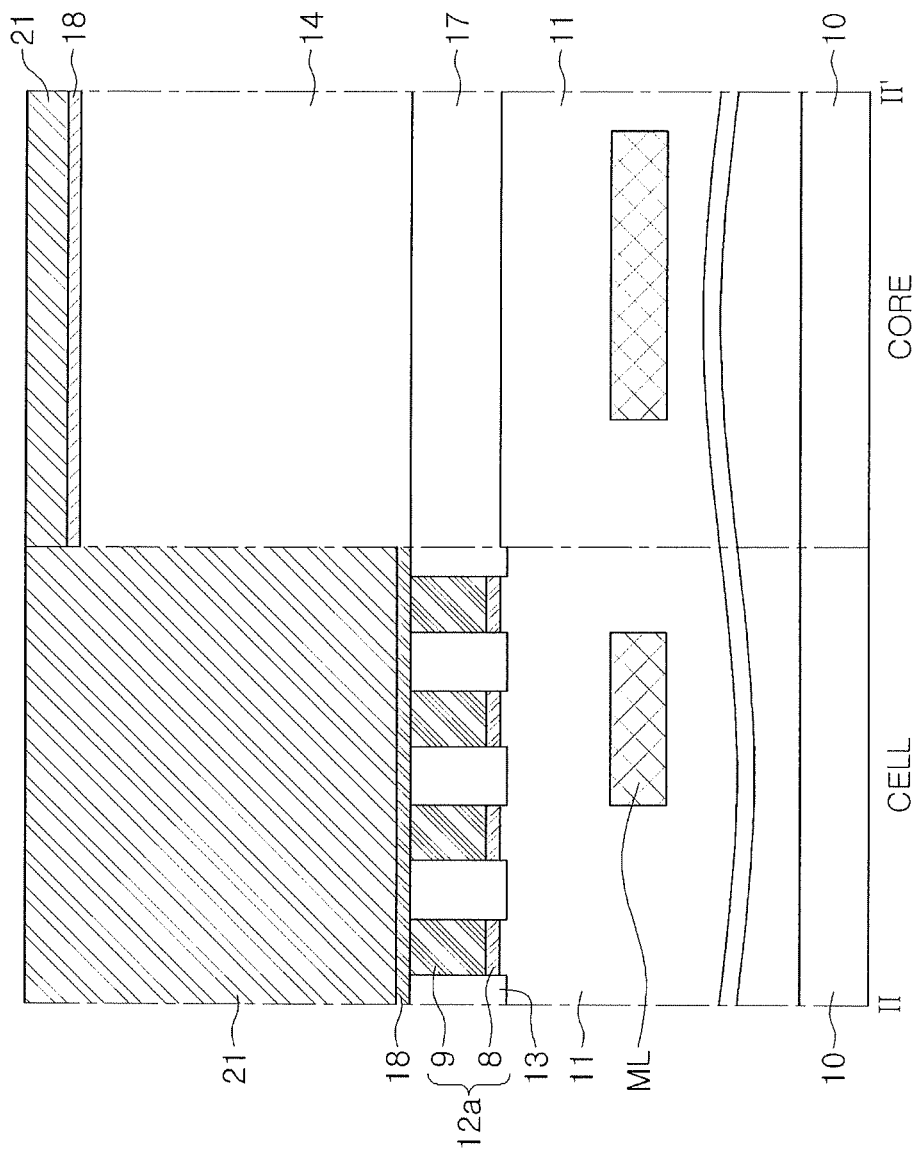

With reference to FIGS. 4 and 5, a base insulating layer 11 may be formed on a substrate 10. The substrate 10 may be provided as a semiconductor substrate, while the base insulating layer 11 may be formed using an insulating material, such as a silicon oxide. The substrate 10 may have a cell region CELL and a core region CORE. The core region CORE may be disposed adjacent to the cell region CELL. After a plurality of circuit transistors are formed on the substrate 10, the base insulating layer 11 may be formed. Circuit wirings ML and first contact plugs CW may be formed in the base insulating layer 11. The first contact plugs CW may be disposed in the core region CORE.

First conductive lines 12a extended in a first direction (e.g., an X-axis direction) may be formed on the base insulating layer 11. First conductive lines 12 may include a first lower conductive layer 8 and a second lower conductive layer 9, sequentially stacked. First gap fill patterns 13 filling a space between the first conductive lines 12a may be formed. The first gap fill patterns 13 may be formed using a silicon oxide or a silicon nitride.

A second interlayer insulating layer 14 may be formed on the first conductive lines 12a and the first gap fill patterns 13 in the cell region CELL and the core region CORE. The second interlayer insulating layer 14 may include an opening 14a having a linear shape in the cell region CELL. The opening 14a of the second interlayer insulating layer 14 may have a linear shape extended in a second direction (e.g., a Y-axis direction) perpendicular to the first conductive lines 12a. A first interlayer insulating layer 17 and the second interlayer insulating layer 14 may be formed on the base insulating layer 11 in a region of the core region CORE.

A lower electrode layer 18, conformally covering the second interlayer insulating layer 14, may be formed. A spacer layer 21, thicker than the lower electrode layer 18, may be conformally formed on the lower electrode layer 18.

Figure 6:
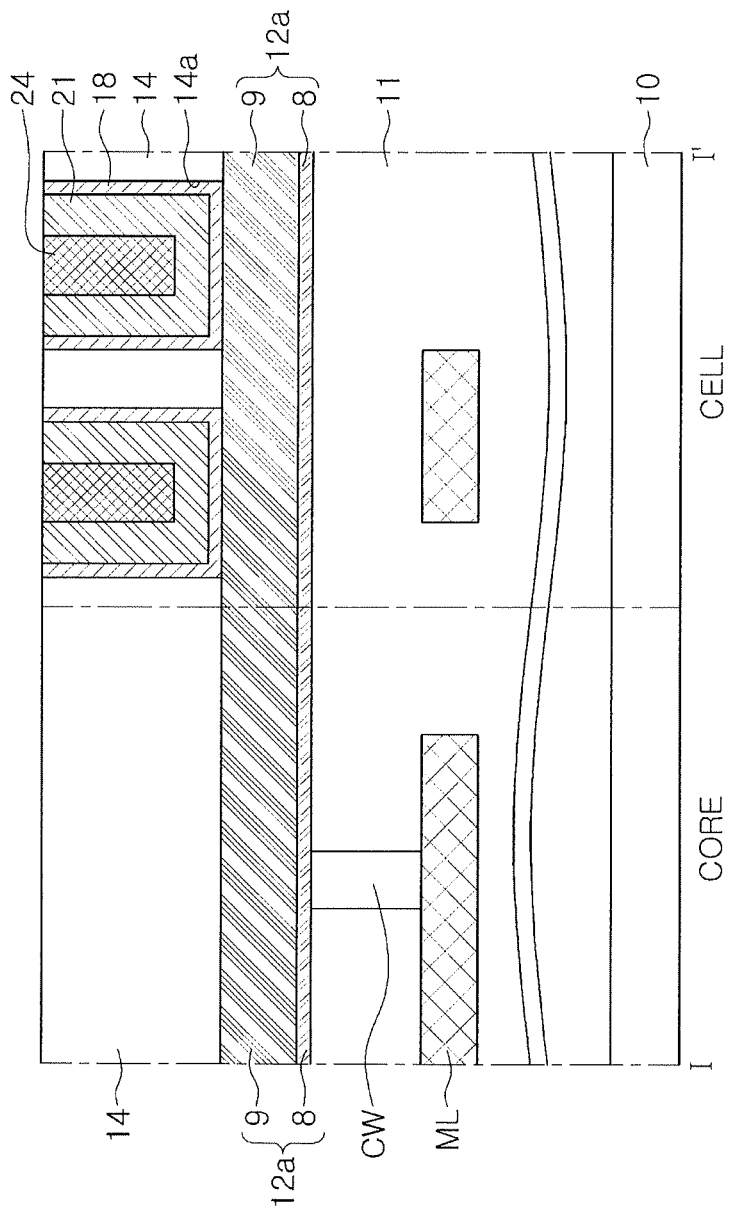
Figure 7:
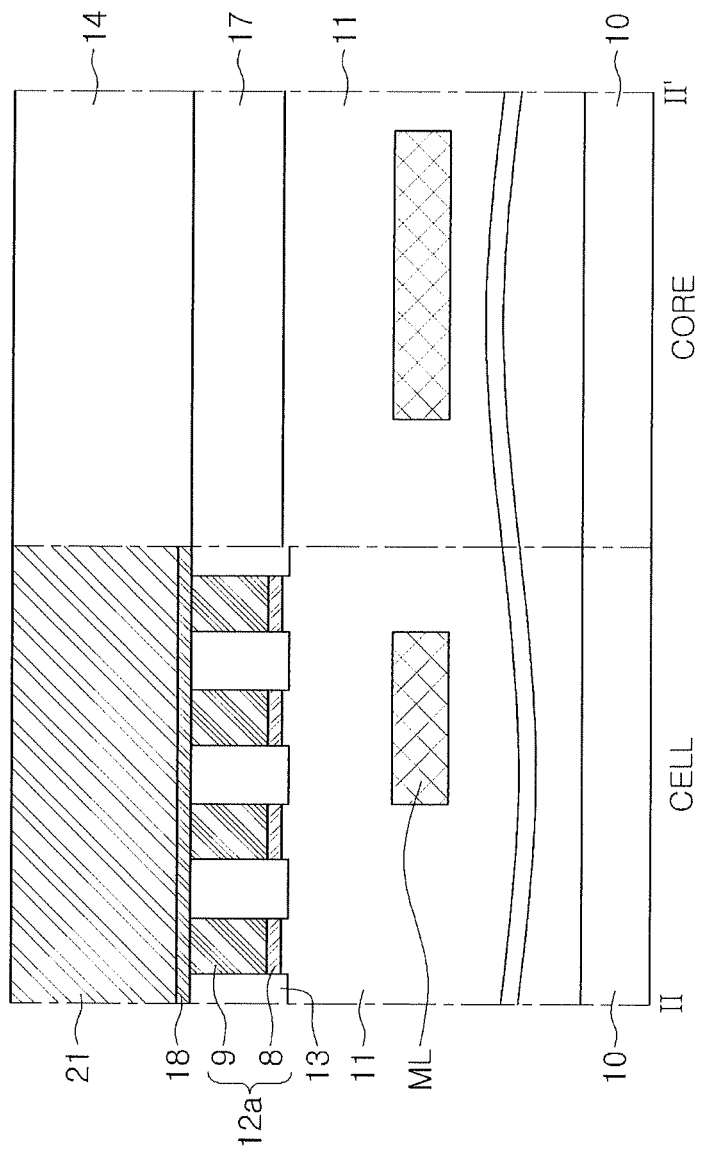

With reference to FIGS. 6 and 7, a first gap fill pattern 24 filling the opening 14a of the second interlayer insulating layer 14 may be formed.

A first gap fill material layer filling the opening 14a may be formed, and a planarization process may be performed until an upper surface of the second interlayer insulating layer 14 is exposed, thereby forming the lower electrode layer 18, the spacer layer 21, and the first gap fill pattern 24, disposed in the opening 14a. Heights of the second interlayer insulating layer 14, the spacer layer 21, and the lower electrode layer 18 may be reduced using the planarization process.

Figure 8:
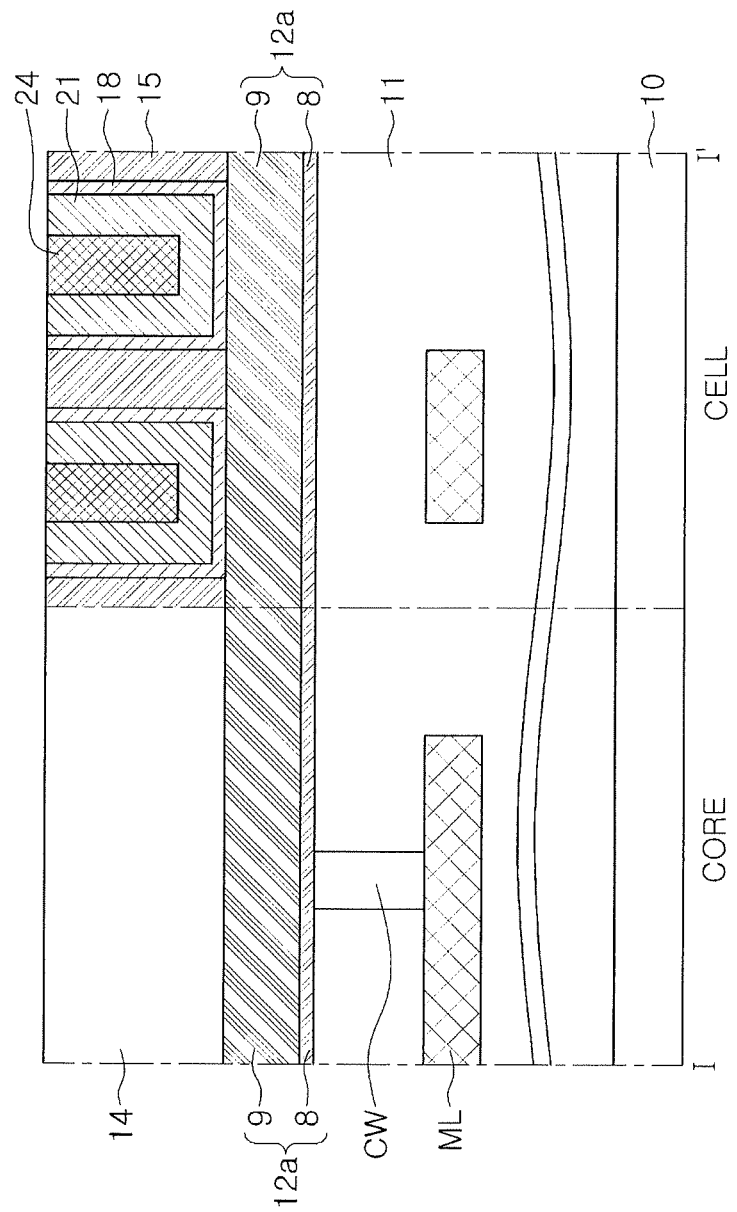
Figure 9:
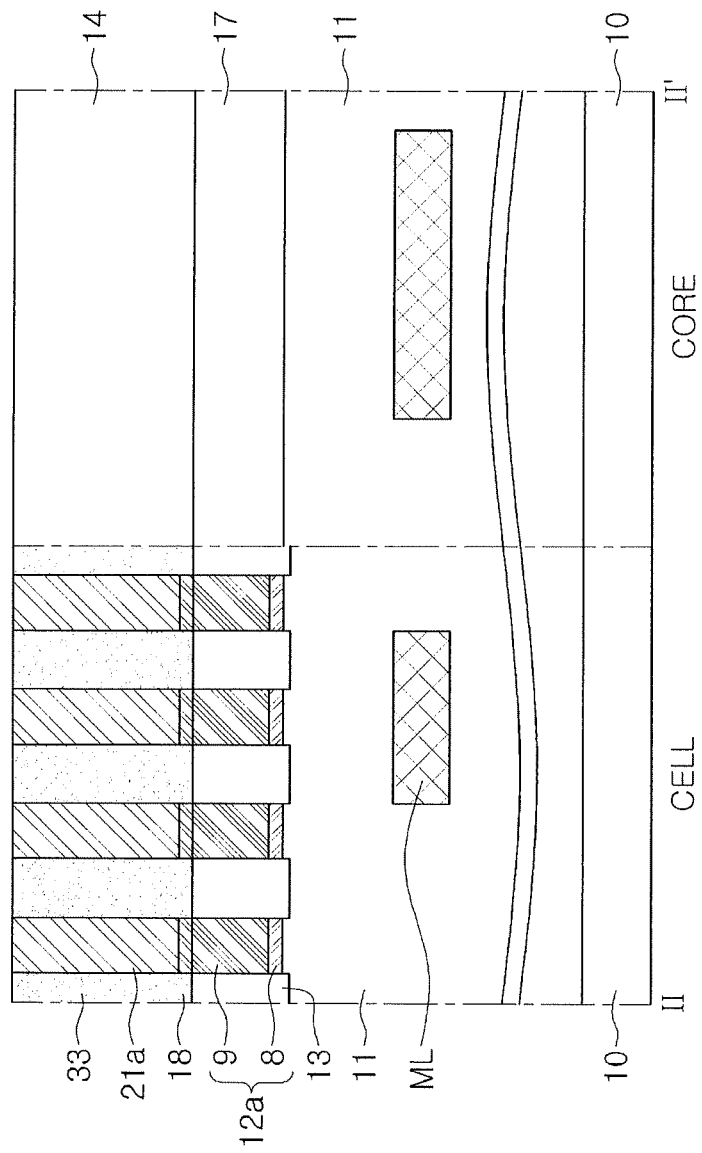

With reference to FIGS. 8 and 9, second insulating patterns 33 extended in the first direction may be formed in the cell region CELL.

First, mask patterns may be formed on the second interlayer insulating layer 14, the lower electrode layer 18, the spacer layer 21, and the first gap fill pattern 24. The mask patterns may have a linear shape extended in the first direction. The second interlayer insulating layer 14, the lower electrode layer 18, the spacer layer 21, and the first gap fill pattern 24 may be etched using the mask patterns as an etching mask, thereby forming trenches having a linear shape. The second interlayer insulating layer 14 remaining in the cell region CELL may be referred to as a first insulating pattern 15 by forming the trenches. After an insulating material layer filling the trenches may be formed, the second insulating patterns 33 may be formed by performing the planarization process. Heights of the second insulating patterns 33, the first insulating patterns 15, and the first gap fill patterns 24 may be reduced using the planarization process.

The lower electrode layer 18, the spacer layer 21, the first gap fill pattern 24, and the first insulating pattern 15 may remain on the first conductive lines 12*a* and may remain between the second insulating patterns 33 in the cell region CELL.

Figure 10:
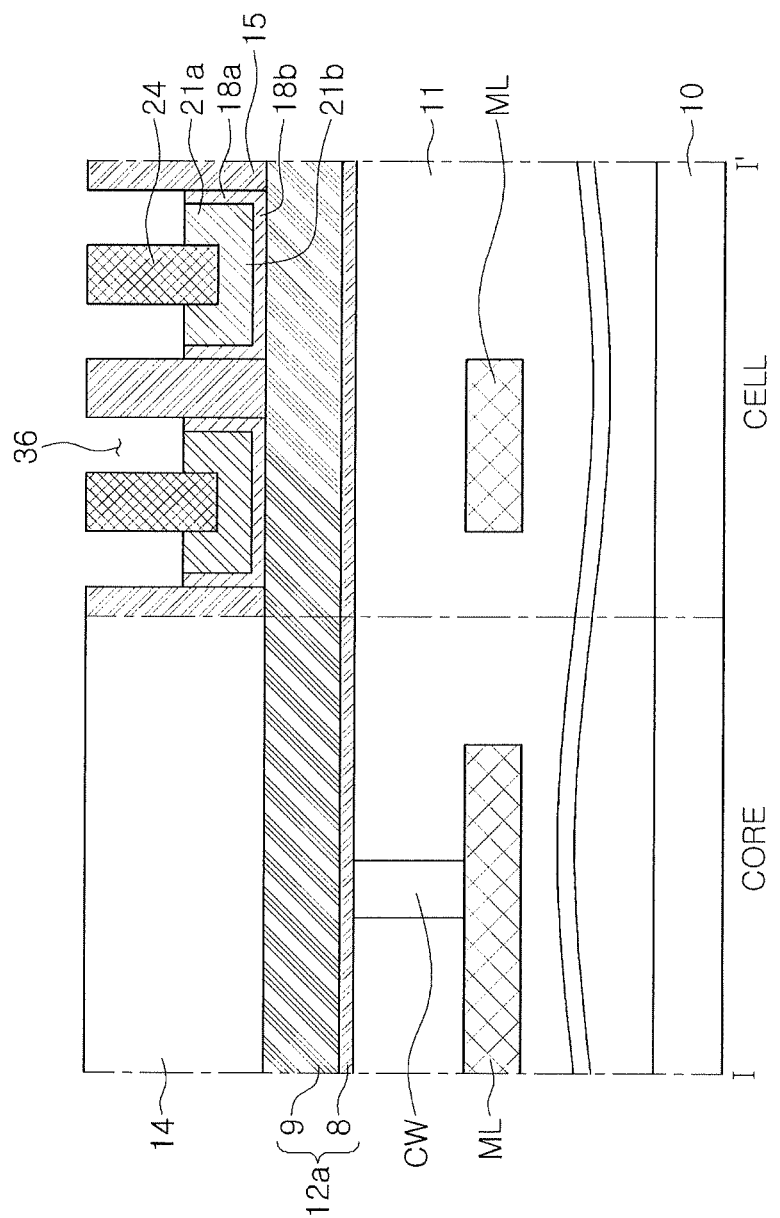
Figure 11:
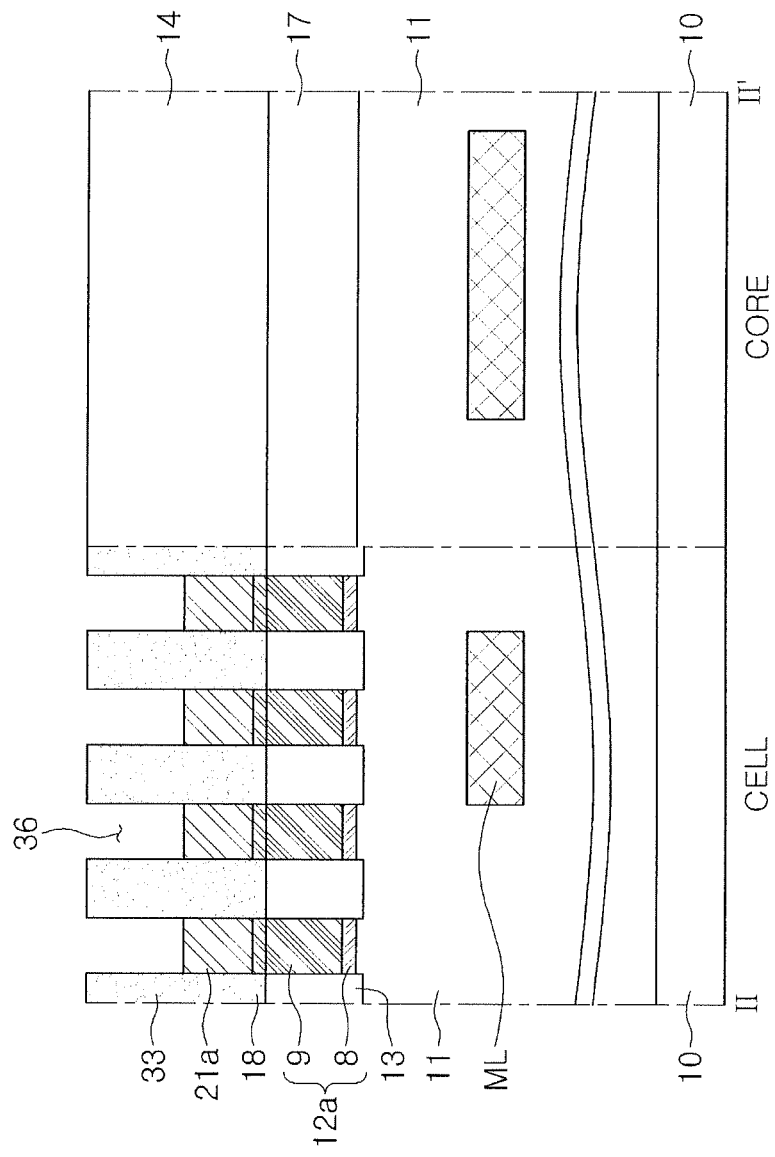

With reference to FIGS. 10 and 11, the lower electrode layer 18 and the spacer layer 21 may be partially etched, thereby forming holes 36 in the cell region CELL. The lower electrode layer 18 partially etched may include lower electrodes 18*a* and a lower electrode connection portion 18*b* extended in the first direction from a lower portion of the lower electrodes 18*a*. The spacer layer 21 partially etched may include spacers 21*a* and a spacer connection portion 21*b* extended in the first direction from a lower portion of the spacers 21*a*.

Figure 12:
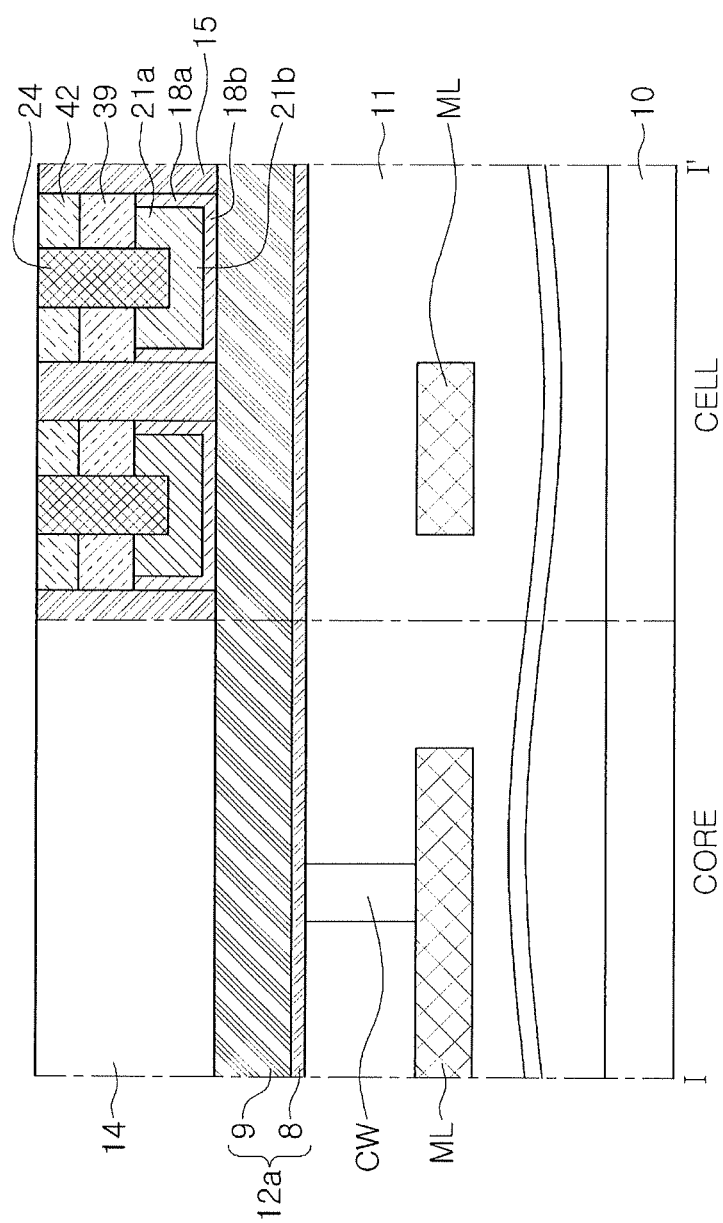
Figure 13:
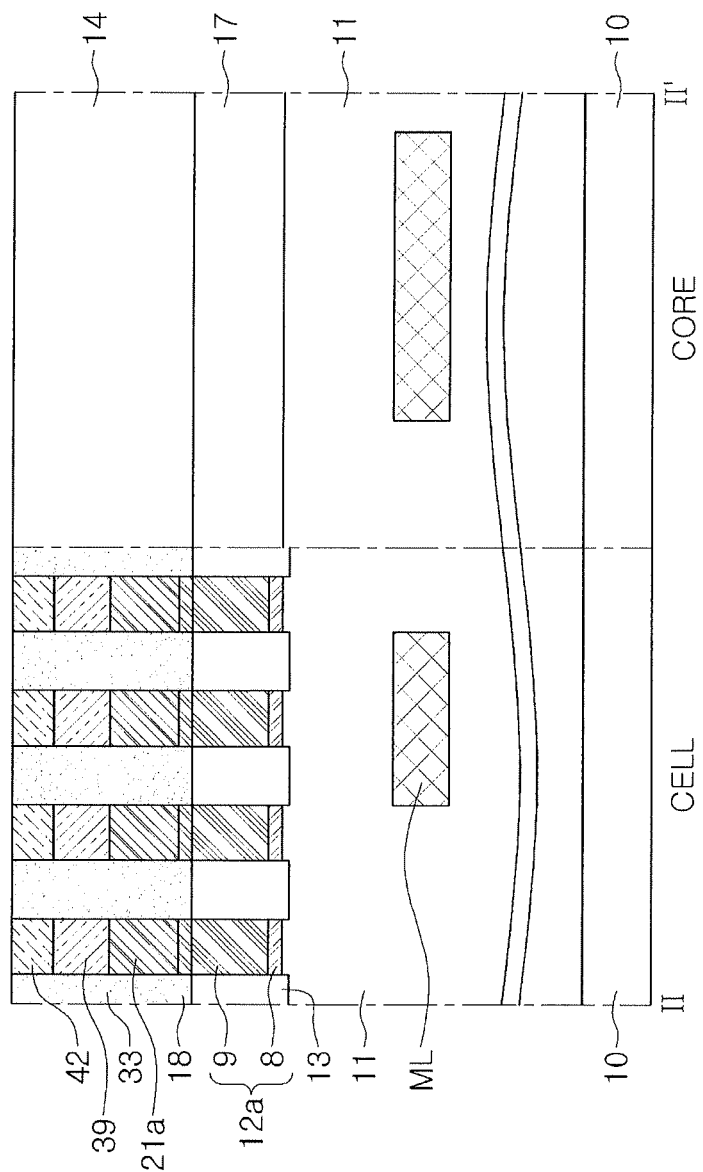

With reference to FIGS. 12 and 13, data storage patterns 39 partially filling the holes 36 may be formed. Upper electrodes 42 may be formed on the data storage patterns 39. The upper electrodes 42 may be formed in the holes 36. The formation of the upper electrodes 42 may include forming an electrode material layer covering the holes 36 and the data storage patterns 39 and exposing the second insulating patterns 33, the first insulating patterns 15, and the first gap fill patterns 24 by performing the planarization process. Heights of the second insulating patterns 33, the first insulating patterns 15, and the first gap fill patterns 24 may be reduced using the planarization process. The second insulating patterns 33, the first insulating patterns 15, the first gap fill pattern 24, and the upper electrodes 42 may have coplanar upper surfaces.

Figure 14:
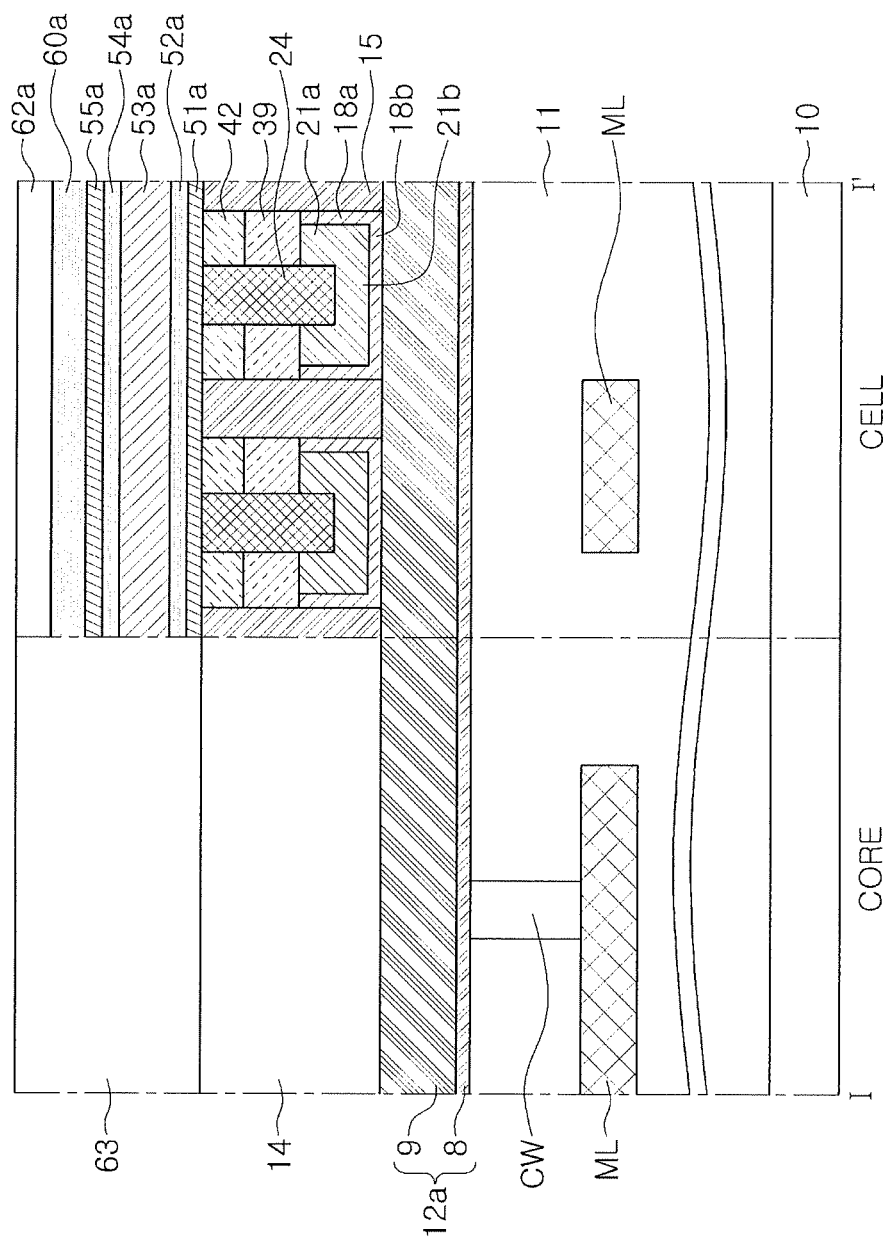
Figure 15:
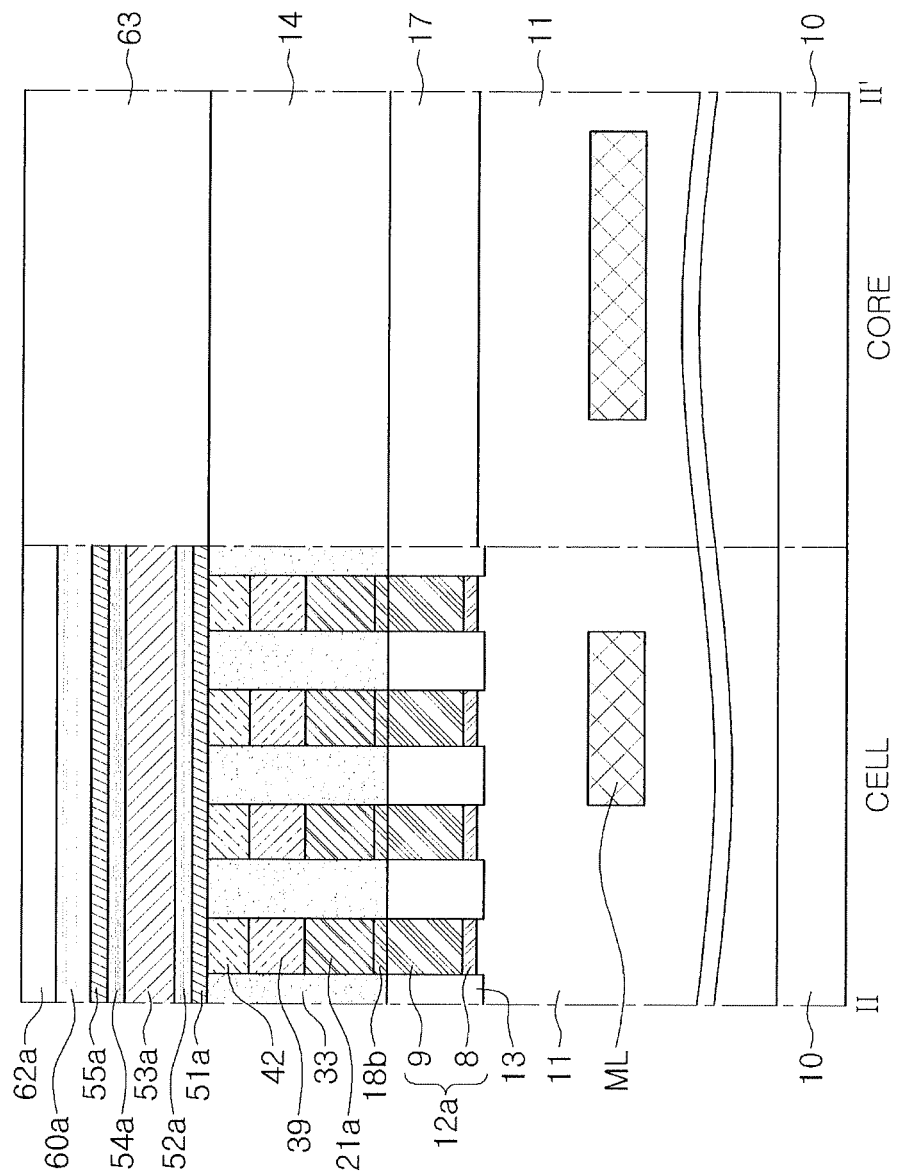

With reference to FIGS. 14 and 15, a lower selector electrode layer 51*a*, a lower interface layer 52*a*, a selector layer 53*a*, an upper interface layer 54*a*, an upper selector electrode layer 55*a*, a connection layer 60*a*, and a mask layer 62*a*, sequentially stacked in the cell region CELL, may be formed. The third interlayer insulating layer 63 may be formed in the core region CORE.

The lower selector electrode layer 51*a*, the lower interface layer 52*a*, the selector layer 53*a*, the upper interface layer 54*a*, the upper selector electrode layer 55*a*, the connection layer 60*a*, and the mask layer 62*a* may be formed on the substrate 10, and then, the lower selector electrode layer 51*a*, the lower interface layer 52*a*, the selector layer 53*a*, the upper interface layer 54*a*, the upper selector electrode layer 55*a*, the connection layer 60*a*, and the mask layer 62*a* may be removed from the core region CORE. Subsequently, after the third interlayer insulating layer 63 is formed on the substrate 10, the third interlayer insulating layer 63 may be removed from the cell region CELL by performing the planarization process.

Figure 16:
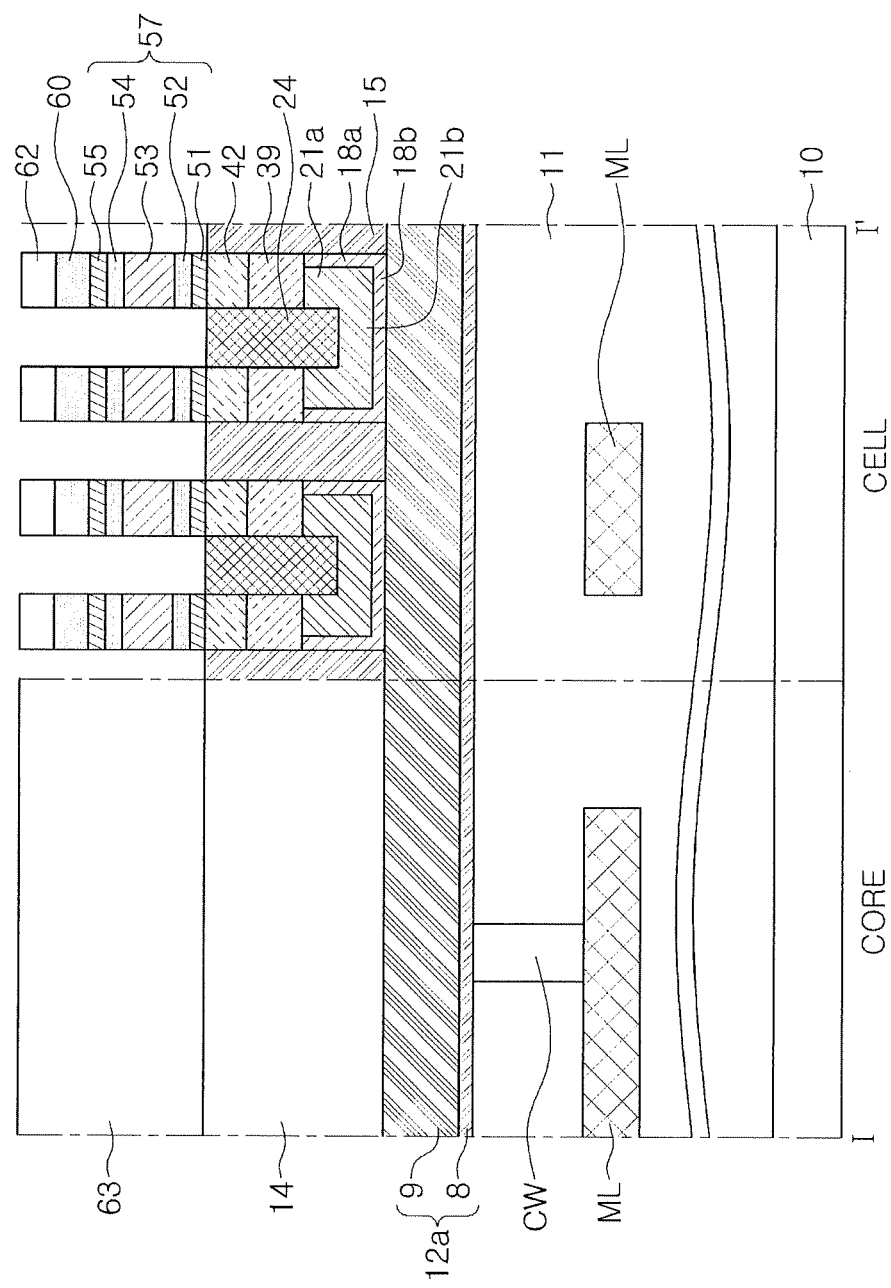
Figure 17:
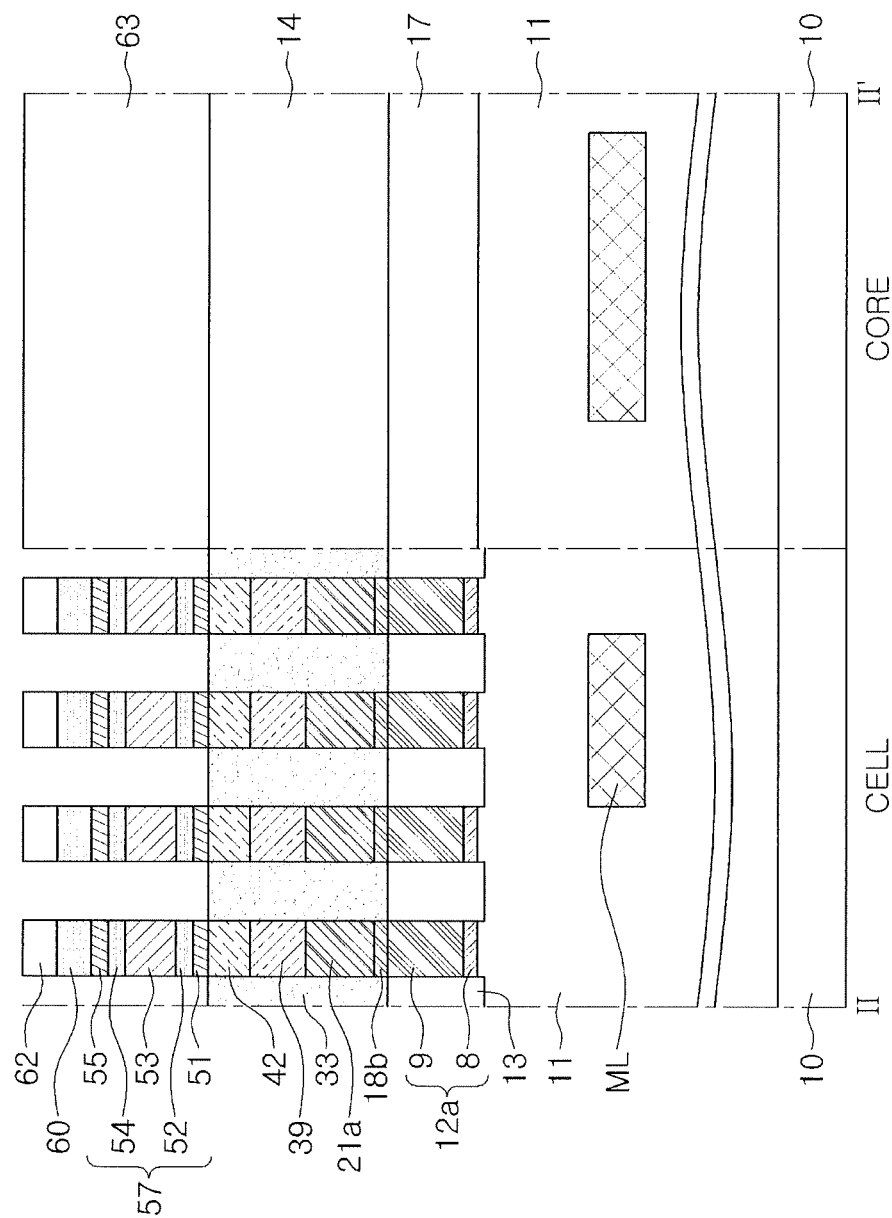

With reference to FIGS. 16 and 17, lower selector electrodes 51, lower interface patterns 52, selectors 53, upper interface patterns 54, upper selector electrodes 55, connection patterns 60, and mask patterns 62 may be formed in the cell region CELL using a patterning process. A lower selector electrode 51, a lower interface pattern 52, a selector 53, an upper interface pattern 54, and an upper selector electrode 55 may form a selector structure 57. Selector structures 57 arranged in a matrix form in the cell region CELL may be formed using the patterning process.

The patterning process may be provided as a process of using, for example, a double patterning process (DPT) using a spacer, twice. In the patterning process, a first double patterning process using first spacer masks extended in the first direction may be performed, and then a second double patterning process using second spacer masks extended in the second direction intersecting the first direction may be performed. A plurality of material layers may be deposited or removed for the patterning process.

Figure 18:
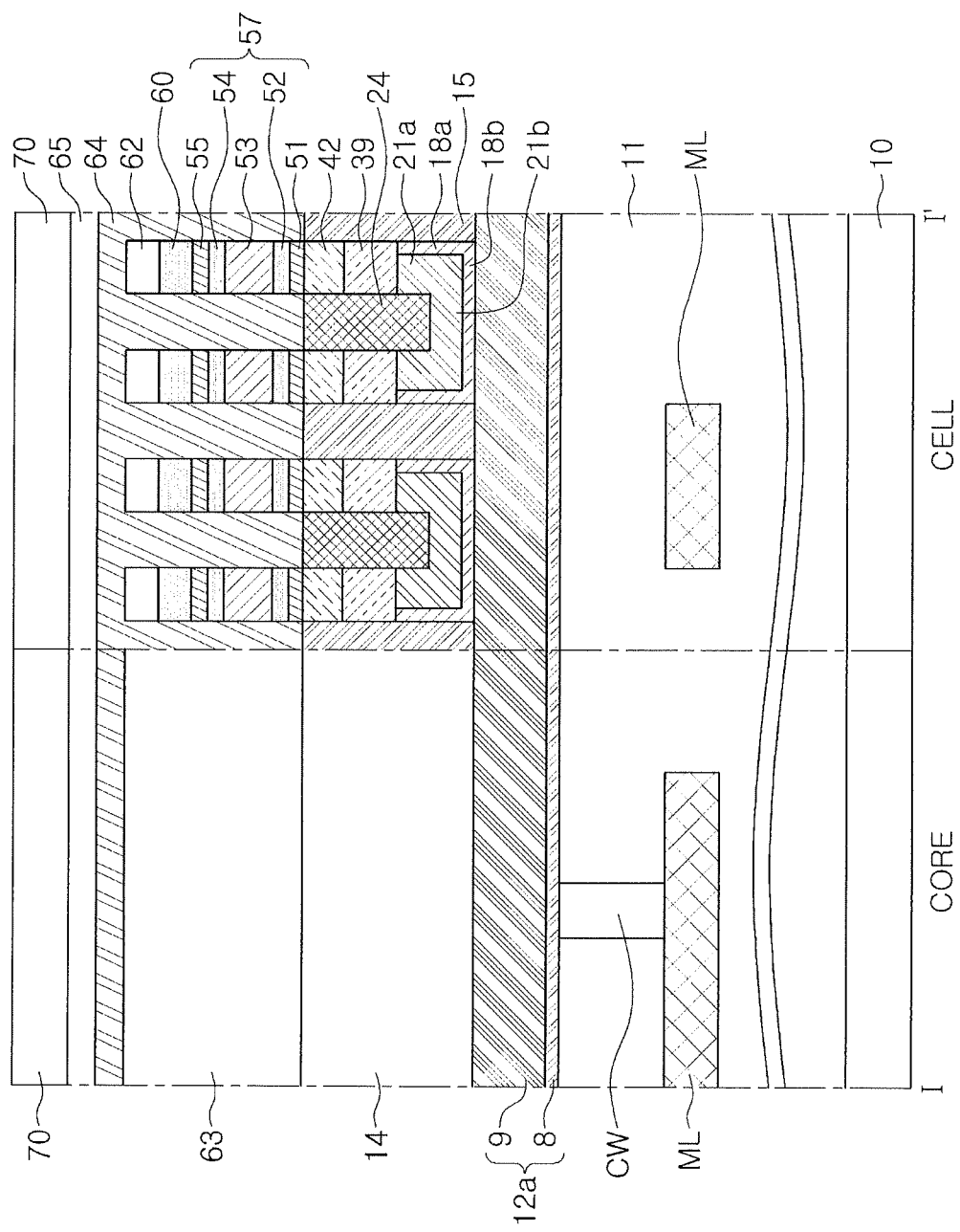
Figure 19:
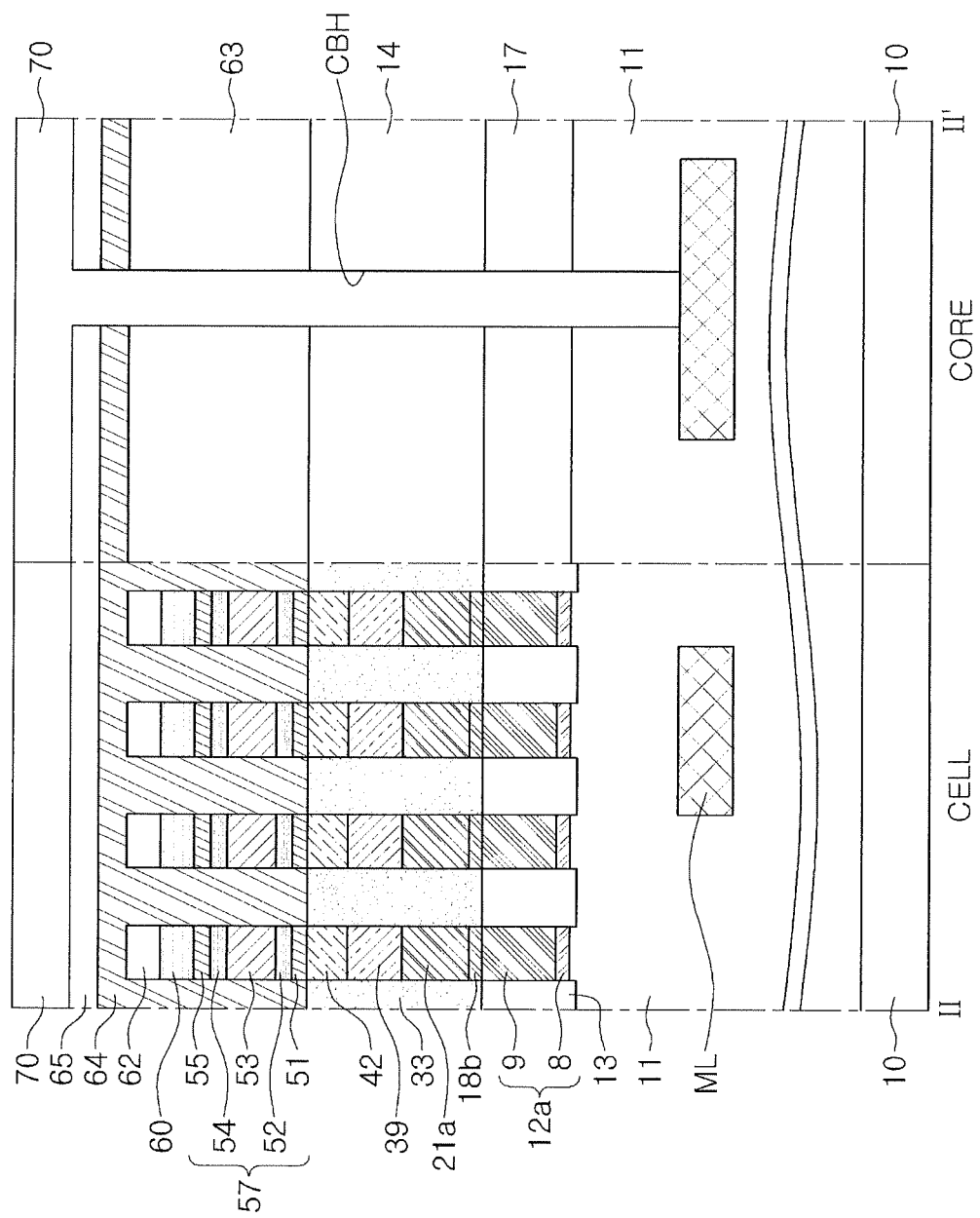

With reference to FIGS. 18 and 19, the gap fill insulating layer 64 filling a space between the selector structures 57 may be formed. A buffer layer 65 and a conductive layer 70 may be formed on the gap fill insulating layer 64.

A contact hole CBH penetrating through the buffer layer 65, the gap fill insulating layer 64, the third interlayer insulating layer 63, the second interlayer insulating layer 14, and the base insulating layer 11 may formed in the core region CORE. The contact hole CBH may expose a portion of the circuit wiring ML. The conductive layer 70 may be formed to fill the contact hole CBH formed in the core region CORE.

Figure 20:
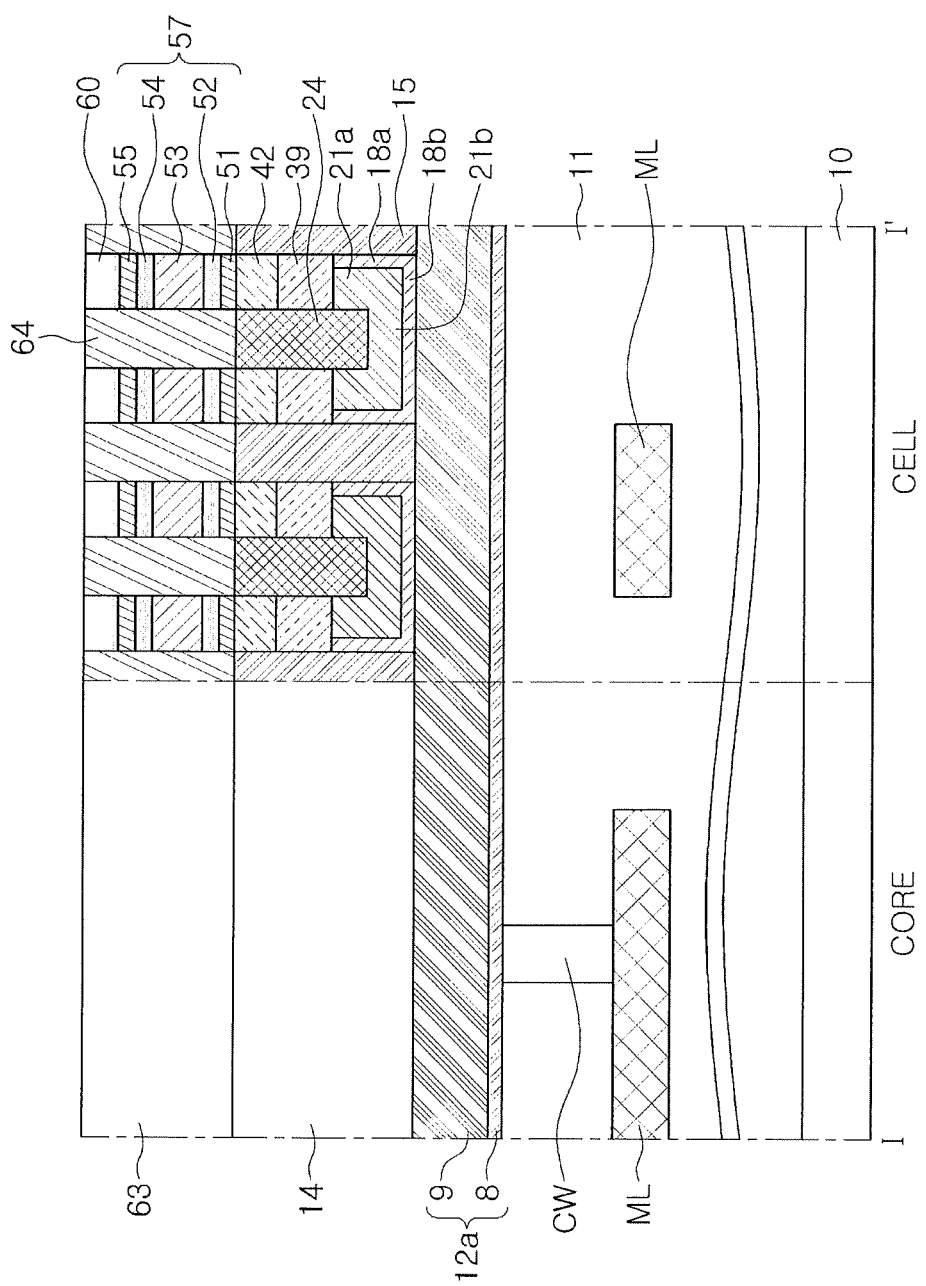
Figure 21:
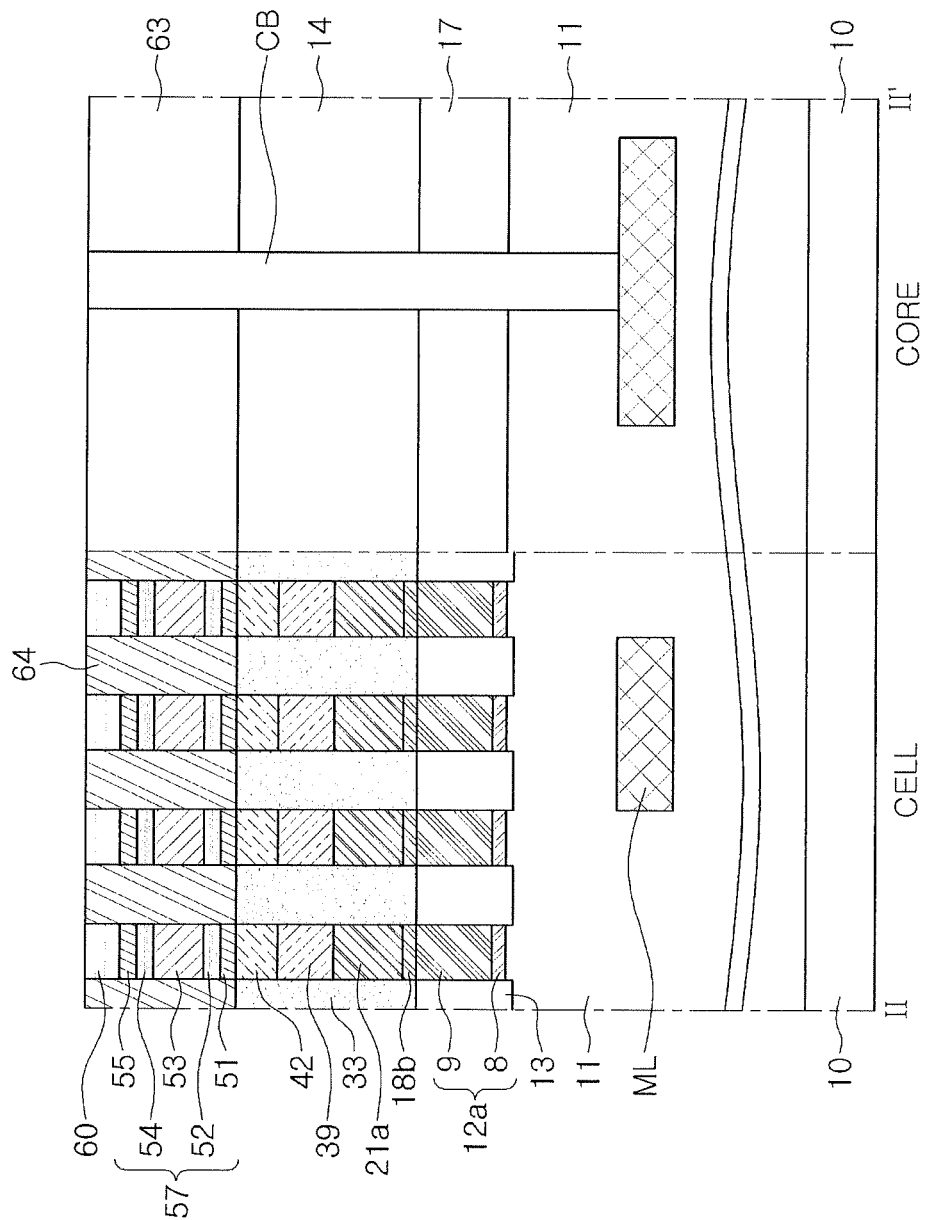

With reference to FIGS. 20 and 21, the conductive layer 70, the buffer layer 65, and a portion of the gap fill insulating layer 64 may be removed so that the connection patterns 60 may be exposed. Removing the conductive layer 70, the buffer layer 65, and the portion of the gap fill insulating layer 64 may include performing the planarization process. The planarization process may include a chemical mechanical polishing (CMP) process, an etch-back process, or a combination thereof.

With reference to FIGS. 2 and 3, the second conductive lines 112*a* and the second gap fill patterns 133 may be formed. The second conductive lines 112*a* may be extended in the second direction (the Y-axis direction).

Figure 22:
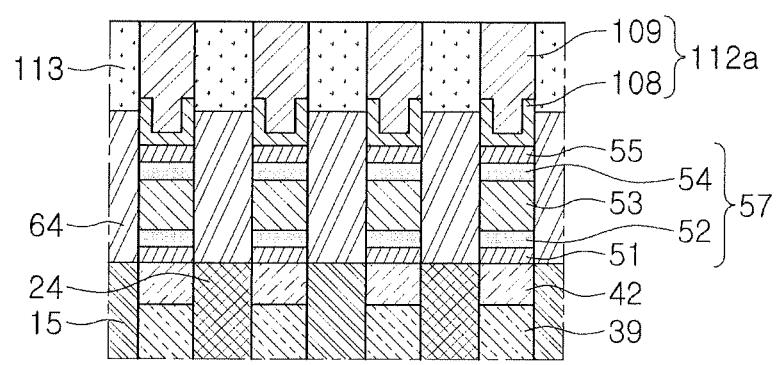
FIGS. 22 and 23 are cross-sections illustrating semiconductor devices in accordance with some embodiments of the present inventive concept.
Figure 23:
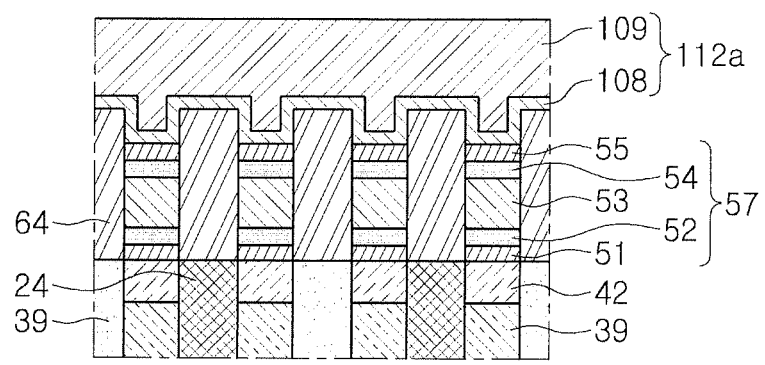

Referring now to FIGS. 22 and 23, cross-sections illustrating semiconductor devices in accordance with some embodiments of the present inventive concept will be discussed. FIGS. 22 and 23 are enlarged views of only regions of FIGS. 2 and 3.

With reference to FIGS. 22 and 23, connection patterns 60 may not be disposed on selector structures 57. An upper surface of a gap fill insulating layer 64 may be higher than an upper surface of the selector structures 57, while second conductive lines 112*a* may be in direct contact with the selector structures 57. The second conductive lines 112*a* may have protrusions in contact with the selector structures 57. The protrusions may be in contact with upper selector electrodes 55.

Figure 24:
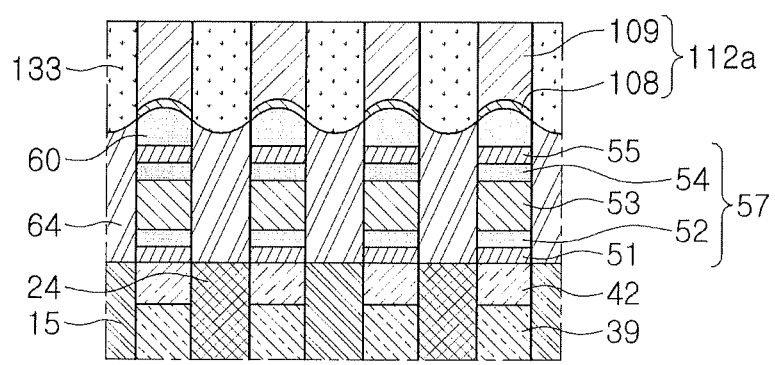
FIGS. 24 and 25 are cross-sections illustrating semiconductor devices in accordance with some embodiments of the present inventive concept.
Figure 25:
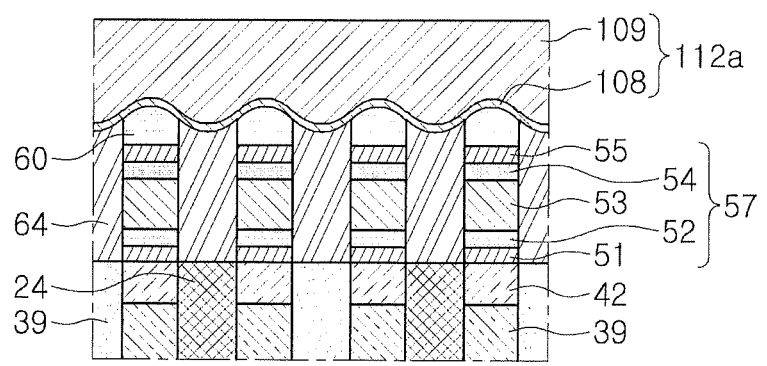

Referring now to FIGS. 24 and 25, cross-sections illustrating semiconductor device in accordance with some embodiments will be discussed. FIGS. 22 and 23 are enlarged views of only regions of FIGS. 2 and 3.

With reference to FIGS. 22 and 23, upper surfaces of the connection patterns 60 may be higher than the upper surface of the gap fill insulating layer 64. The upper surfaces of the connection patterns 60 may be convex, while the upper surface of the gap fill insulating layer 64 may have concave grooves. Second conductive lines 112*a* may have concave grooves in contact with the upper surfaces of the connection patterns 60.

The upper surface of the gap fill insulating layer 64 may be higher than the upper surface of the selector structures 57.

As set forth above, according to some embodiments of the present inventive concept, the likelihood of a loss of upper selector electrodes may be reduced, or possibly prevented, and contact resistance variation between a conductive line and an electrode may be improved. Furthermore, a loss of a gap fill insulating layer surrounding selector structures may be inhibited, thereby protecting the selector structures in a manufacturing process. Thus, productivity and reliability of a semiconductor device may be improved in accordance with embodiments discussed herein.

While embodiments have been shown and described above, it will be apparent to those skilled in the art that modifications and variations could be made without departing from the scope of the present inventive concept as defined by the appended claims.

What is claimed is:

1. A semiconductor device, comprising:
a base insulating layer on a substrate;
a first conductive line extending in a first direction on the base insulating layer; data storage structures on the first conductive line, each of the data storage structures including a lower electrode, a data storage pattern above the lower electrode and comprising a phase-change material, and an upper electrode above the data storage pattern;
a lower electrode connection portion extended from a lower portion of the lower electrode in the first direction;
a spacer disposed between the first conductive line and the data storage pattern, a lateral surface of the space in contact with a lateral surface of the lower electrode;
a spacer connection portion extended from a lower portion of the spacer in the first direction;
selector structures on the data storage structures, each of the selector structures including a lower selector electrode, a selector above the lower selector electrode and comprising a threshold switching material, and an upper selector electrode above the selector, the selector structures defining a space therebetween;
an insulating layer in the space between the selector structures; and
a second conductive line on the selector structures and the insulating layer and extending in a second direction, different from and, intersecting the first direction,
wherein an upper surface of the insulating layer is higher than an upper surface of the upper selector electrode above the selector, and an upper surface of the upper electrode above the data storage pattern, and
wherein the lower electrode is disposed between the data storage pattern and the first conductive line, the lower electrode extended in the second direction, and in contact with a lower surface of the data storage pattern.

2. The semiconductor device of claim 1, further comprising connection patterns on the selector structures.

3. The semiconductor device of claim 2, wherein upper surfaces of the connection patterns are coplanar with the upper surface of the insulating layer.

4. The semiconductor device of claim 2, wherein a width of the connection patterns is equal to a width of the upper selector electrode.

5. The semiconductor device of claim 1, wherein the substrate, the data storage structures, and the selector structures are sequentially stacked.

6. A semiconductor device, comprising:
a first conductive line extending in a first direction on a substrate;
a second conductive line extending in a second direction, different from and intersecting the first direction;
data storage structures between the first conductive line and the second conductive line, each of the data storage structures including a lower electrode, a data storage pattern above the lower electrode and comprising a phase-change material, and an upper electrode above the data storage pattern;
a lower electrode connection portion extended from the lower portion of the lower electrode in the first direction;
a spacer disposed between the data storage pattern and the first conductive line, the spacer in contact with the lower surface of the data storage pattern together the lower electrode;
a spacer connection portion extended from a lower portion of the spacer in the first direction;
switch structures between the first conductive line and the second conductive line, each of the switch structures including a lower switch electrode, a switch above the lower switch electrode and comprising a threshold switching material, and an upper switch electrode above the switch, the switch structures defining a space therebetween;
an insulating layer in the space between the switch structures; and
connection patterns on the switch structures,
wherein an upper surface of the insulating layer is higher than an upper surface of the upper switch electrode,
wherein the substrate, the data storage structures, the switch structures, and the connection patterns are sequentially stacked, and
wherein the lower electrode is disposed between the first conductive line and the data storage pattern, the lower electrode extended in the second direction, and in contact with a lower surface of the data storage pattern.

7. The semiconductor device of claim 6, wherein each of the switch structures further comprises an upper interface pattern between the upper switch electrode and the switch and a lower interface pattern between the lower switch electrode and the switch.

8. The semiconductor device of claim 7, wherein the plugs, the upper interface pattern, and the lower interface pattern include a same material.

9. The semiconductor device of claim 6, wherein upper surfaces of the connection patterns are coplanar with an upper surface of the insulating layer.

10. The semiconductor device of claim 6, wherein the first conductive line, the data storage structures, the switch structures, the connection patterns, and the second conductive lines are sequentially stacked.

11. A semiconductor device, comprising:
a base insulating layer on a substrate;
a first conductive line extending in a first direction on the base insulating layer;
data storage structures on the first conductive line and including a data storage pattern comprising a phase-change material;
selector structures on the data storage structures and defining a space therebetween;
an insulating layer in the space between the selector structures;
second conductive lines on the selector structures and the insulating layer and extending in a second direction, different from and intersecting the first direction;
connection patterns on the selector structures, upper surfaces of the connection patterns coplanar with an upper surface of the insulating layer;
a lower electrode between the first conductive line and the data storage structures, the lower electrode extended in the second direction;
a lower electrode connection portion extended from a lower portion of the lower electrode in the first direction;

a spacer disposed between the first conductive line and the data storage structures, a lateral surface of the spacer in contact with a lateral surface of the lower electrode; and a space connection portion extended from a lower portion of the spacer in the first direction, wherein each of the selector structures includes a lower selector electrode, a lower interface pattern, a selector comprising a threshold switching material, an upper interface pattern above the selector, and an upper selector electrode above the upper interface pattern, and an upper surface of the insulating layer is higher than an upper surface of the upper selector electrode.

12. The semiconductor device of claim 11, wherein the substrate, the first conductive line, the data storage structures, the selector structures, the connection patterns, and the second conductive line are sequentially stacked.

* * * * *